(12) United States Patent
Nishimura

(10) Patent No.: US 7,514,965 B2
(45) Date of Patent: Apr. 7, 2009

(54) VOLTAGE COMPARATOR CIRCUIT WITH SYMMETRIC CIRCUIT TOPOLOGY

(75) Inventor: Kouichi Nishimura, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 74 days.

(21) Appl. No.: 11/274,183

(22) Filed: Nov. 16, 2005

(65) Prior Publication Data

US 2006/0103433 A1    May 18, 2006

(30) Foreign Application Priority Data

Nov. 17, 2004   (JP)   ............................. 2004-333654

(51) Int. Cl.
*H03K 5/22* (2006.01)
(52) U.S. Cl. .......................................... 327/66; 327/53
(58) Field of Classification Search .................. 327/52, 327/53, 65, 66, 77–81, 88, 89
See application file for complete search history.

(56) References Cited

U.S. PATENT DOCUMENTS

| | | | | |
|---|---|---|---|---|
| 4,618,815 | A * | 10/1986 | Swanson | 323/315 |
| 5,359,296 | A * | 10/1994 | Brooks et al. | 330/288 |
| 5,469,047 | A | 11/1995 | Kumamoto et al. | |
| 5,699,010 | A * | 12/1997 | Hatanaka | 327/563 |
| 5,764,086 | A * | 6/1998 | Nagamatsu et al. | 327/65 |
| 5,835,994 | A | 11/1998 | Adams | |
| 5,966,005 | A | 10/1999 | Fujimori | |
| 6,172,535 | B1 * | 1/2001 | Hopkins | 327/66 |
| 6,252,435 | B1 * | 6/2001 | Wu et al. | 327/65 |
| 6,388,508 | B1 | 5/2002 | Kawasumi | |
| 6,396,335 | B1 | 5/2002 | Behzad et al. | |
| 6,429,735 | B1 * | 8/2002 | Kuo et al. | 327/563 |
| 6,531,915 | B2 * | 3/2003 | Behzad et al. | 327/543 |
| 6,535,031 | B1 * | 3/2003 | Nguyen et al. | 327/65 |
| 6,617,915 | B2 * | 9/2003 | Rajan | 327/538 |
| 6,777,984 | B2 * | 8/2004 | Hangaishi | 327/66 |
| 6,803,808 | B2 | 10/2004 | Wu | |

(Continued)

FOREIGN PATENT DOCUMENTS

JP   3-62712   3/1991

*Primary Examiner*—Donovan Lincoln
*Assistant Examiner*—William Hernandez
(74) *Attorney, Agent, or Firm*—McGinn IP Law Group, PLLC

(57) ABSTRACT

A voltage comparator circuit is composed of a differential amplifier circuit receiving a pair of input signals to develop an output signal on an output terminal, and a waveform shaping circuit connected to the output terminal. The differential amplifier circuit includes: a first differential transistor pair responsive to the pair of input signals to output first and second output currents; a second differential transistor pair responsive to the pair of input signals to output third and fourth output currents; a first current mirror circuit developing a first internal current in response to the first output current; a third current mirror circuit complementary to the first current mirror circuit and developing a third internal current in response to the third output current; a second current mirror circuit developing a second internal current in response to the second output current and the third internal current; and a fourth current mirror circuit complementary to the second current mirror circuit and developing a fourth internal current in response to the fourth output current and the first internal current. A resultant current which is said second and fourth internal currents added together is drawn from or supplied to the output terminal of the differential amplifier circuit.

18 Claims, 10 Drawing Sheets

U.S. PATENT DOCUMENTS 6,844,781 B1 * 1/2005 Walsh et al. ................. 330/252
2004/0189386 A1 * 9/2004 Nishimura ................. 330/253
2004/0247036 A1 * 12/2004 Hedberg et al. ............. 375/257
2006/0038113 A1 2/2006 Riedel et al.

* cited by examiner

US 7,514,965 B2

VOLTAGE COMPARATOR CIRCUIT WITH SYMMETRIC CIRCUIT TOPOLOGY

BACKGROUND OF THE INVENTION

1. Field of the Invention

The present invention relates to a voltage comparator circuit, and in particular, relates to a voltage comparator circuit suitable for a high-speed differential signal interface.

2. Description of the Related Art

Differential signaling is one of the well-known approaches for achieving a high-speed signal interface. For example, RSDS™ (Reduced Swing Differential Signaling), and mini-LVDS™ (Low Voltage Differential Signaling) are going to be standardized as an interfacing scheme between an LCD (Liquid Crystal Display) driver and a timing controller within an LCD apparatus.

Receiver circuits used for differential signaling typically incorporate a voltage comparator circuit with differential inputs. Differential signals received by a differential signal receiver typically have a frequency of approximately 85 MHz for RSDS™, and 200 MHz for mini-LVDS™. The amplitude of the differential signal component of the differential signals is approximately ±50 mV, and the amplitude of the common-mode signal component ranges from 0.3 V to $V_{DD}$–0.5 V, where $V_{DD}$ is a power supply voltage. A voltage comparator circuit within a receiver circuit is required to meet the specifications described above. With a circuit configuration presently released, however, it is difficult to satisfy both the specifications of the common-mode signal component, and an operation speed at the same time.

A voltage comparator circuit adapted to differential signals is typically based on a differential amplifier topology. FIG. 1 is a circuit diagram illustrating a structure of a differential amplifier circuit disclosed in Japanese Laid Open Patent Application (JP-A-Heisei, 03-62712). The conventional differential amplifier circuit is provided with first and second differential transistor pairs DF11 and DF12, first to fifth current mirror circuits CM11 to CM15, and first and second constant current sources I11 and I12.

The first differential transistor pair DF11 is composed of first and second P-channel MOS transistors MP11 and MP12. Correspondingly, the second differential transistor pair DF12 is composed of first and second N-channel MOS transistors MN11 and MN12.

The first current mirror circuit CM11 has an input terminal connected to the drain of the first P-channel MOS transistor MP11, a common terminal connected to an earth terminal ($V_{SS}$ terminal), and an output terminal connected to the input terminal of the fifth current mirror circuit CM15. The second current mirror circuit CM12, on the other hand, has an input terminal connected to the drain of the second P-channel MOS transistor MP12, a common terminal connected to the $V_{SS}$ terminal, and an output terminal connected to an output terminal OUT of the differential amplifier circuit.

The third current mirror circuit CM13 has an input terminal connected to the drain of the first N-channel MOS transistor MN11, a common terminal connected to a power supply terminal ($V_{DD}$ terminal), and an output terminal connected to the drain of the second P-channel MOS transistor MP12 and also to the input terminal of the second current mirror circuit CM12. The fourth current mirror circuit CM14 has an input terminal connected to the drain of the second N-channel MOS transistor MN12, a common terminal connected to the $V_{DD}$ terminal; and the output terminal is connected to the input terminal of the first current mirror circuit CM11 and also to the drain of the first P-channel MOS transistor MP11. Finally, the fifth current mirror circuit CM15 has an input terminal connected to the output terminal of the first current mirror circuit CM11, a common terminal connected to the $V_{DD}$ terminal, and an output terminal connected to the output terminal of the second current mirror circuit CM12 and also to the output terminal OUT of the differential amplifier circuit.

The first constant current source I11 is connected between the $V_{DD}$ terminal and the commonly-connected sources of the first and second P-channel MOS transistor MP11 and MP12. The second constant current source I12 is connected between the $V_{SS}$ terminal and the commonly-connected sources of the first and second N-channel MOS transistors MN11 and MN12.

The gates of the first P-channel MOS transistor MP11 and the first N-channel MOS transistor MN11 are commonly connected to an inverting input terminal In⁻ of the differential amplifier circuit. Correspondingly, the gates of the second P-channel MOS transistor MP12 and the second N-channel MOS transistor MN12 are commonly-connected to non-inverting input terminal In⁺.

Operation analysis the conventional differential amplifier circuit shown in FIG. 1 is given in the following.

First, basic operation of a differential transistor pair is described with reference to FIGS. 2 and 3. FIG. 2 shows a basic circuit configuration of the differential transistor pair, and FIG. 3 shows input-to-output characteristics of the differential transistor pair. The studied differential transistor pair is composed of N-channel MOS transistors MN21 and MN22 having commonly-connected sources. A constant current source ISS for supplying an electric current Iss is connected between the commonly-connected sources and a $V_{SS}$ terminal. When a set of DC voltages Vi1 and Vi2 are supplied to the gates of the N-channel MOS transistors MN21, and MN22, respectively, the following formula (1) holds:

$$V_{i1} - V_{GS1} + V_{GS2} - V_{i2} = 0 \quad (1)$$

where $V_{GS1}$ and $V_{GS2}$ are gate-source voltages of the N-channel MOS transistors MN21 and MN22, respectively.

Additionally, the gate-source voltages $V_{GS1}$ and $V_{GS2}$ are represented by the following formulas:

$$\beta = \frac{W}{L} \mu C_O \quad (2)$$

$$V_{GS1} = \sqrt{\frac{2 I_{d1}}{\beta}} + V_T \quad (3)$$

$$V_{GS2} = \sqrt{\frac{2 I_{d2}}{\beta}} + V_T \quad (4)$$

where $I_{d1}$ and $I_{d2}$ are drain currents through the MOS transistors MN21 and MN22, respectively, and W and L are the gate width and length of the N-channel MOS transistors MN21 and MN22, respectively; $\mu$ is the mobility, and $C_O$ is the gate oxide film capacitance per unit area; finally, $V_T$ is the threshold voltage of the N-channel MOS transistors MN21 and MN22.

From formulas (1) to (4), a minimum voltage difference $\Delta V_{id}$ between the input voltages $V_{i1}$ and $V_{i2}$ at which the whole of the bias current Iss from the constant current source ISS flows only through the N-channel MOS transistor MN21 is indicated by the following formula (5):

$$\Delta V_{id} = V_{i1} - V_{i2} = \left( \sqrt{\frac{2I_{SS}}{\beta}} + V_T \right) - V_T = \sqrt{\frac{2I_{SS}}{\beta}} \quad (5)$$

In the following, a common gate-source voltage VGS0 is defined as the gate-source voltages of the N-channel MOS transistors MN21 and MN22 for $V_{i1} = V_{i2}$. Since the drain currents Id1 and Id2 through the N-channel MOS transistors MN21 and MN22 are each identical to half of the bias current Iss, the common gate-source voltage VGS0 is represented by the following formula (6):

$$V_{GS0} = \sqrt{\frac{I_{SS}}{\beta}} + V_T \quad (6)$$

From formulas (5) and (6), the minimum voltage difference ΔVid at which the differential transistor pair appropriately operates is represented as follows:

$$\therefore \Delta V_{id} = \sqrt{2}(V_{GS0} - V_T) \quad (7)$$

Formula (7) presents the condition under which the bias current flows through only one MOS transistor within the differential transistor pair.

Thus, the bias current flows through only one transistor, not through the other transistor within the differential transistor pair, when the input voltage difference is equal to or more than the value defined by formula (7). This operation is the basic principle of comparator operation. The differential transistor pair exhibits the input-to-output characteristics shown in FIG. 3; the horizontal axis represents the voltage difference between the input voltages Vi1 and Vi2, and the vertical axis represents the drain currents through the N-channel MOS transistors MN21 and MN22.

It should be noted that the comparator operation may be sufficiently achieved when the voltage difference is equal to or below the value defined by formula (7), depending on a configuration of a next circuit stage connected to the differential transistor pair; this is because the differential transistor pair has a sufficient gain.

Next, the conventional differential amplifier circuit in FIG. 1 is then analyzed in the following. The circuit shown in FIG. 1 is responsive to the input voltage levels to operate in selected one of three operation modes: (1) an operation mode in which both the first and second differential transistor pairs DF11 and DF12 are activated, (2) an operation mode in which only the first differential transistor pair DF11 is activated; and (3) an operation mode in which only the second differential transistor pair DF12 is activated.

(1) In Case when Both of First and Second Differential Transistor Pairs DF11 and DF12 are Activated Both of the first and second differential transistor pairs DF11 and DF12 are activated when the conditions defined by the following formula are satisfied.

$$V_{DD} - (V_{GS(MP)} + V_{DS(sat)(I11)}) > V_{in} > V_{GS(MN)} + V_{DS(sat)(I12)} \quad (8)$$

where Vin is any of the input voltages Vin⁻ and Vin⁺ supplied to the inverting and non-inverting input terminals In⁻ and In⁺, respectively; $V_{GS(MP)}$ is the gate-source voltage of the P-channel MOS transistors MP11 or MP12, and $V_{GS(MN)}$ is the gate-source voltage of the N-channel MOS transistor MN11 or MN12; $V_{DS(sat)(I11)}$ is a drain-source voltage at saturation of a P-channel MOS transistor (not shown) within the current source I11; and $V_{DS(sat)(I12)}$ is the drain-source voltage at saturation of an N-channel MOS transistor (not shown) within the current source I12. It should be noted that a drain-source voltage at saturation of a MOS transistor is a voltage barely enough for the MOS transistor to operate in a pentode region.

(1-a) Operation for Vin⁻>Vin⁺

First, a description is given for a case where the input voltage Vin⁻ is higher than the input voltage Vin⁺, and the difference between the input voltages Vin⁻ and Vin⁺ is larger than the voltage ΔVid, defined by formula (7). It should be noted that the input voltages Vin⁻ and Vin⁺ are defined as the voltages applied to the inverting input terminals In⁻ and In⁺, respectively. In this case, the differential amplifier circuit performs voltage comparator operation, and thus the bias current I1 flows only through the P-channel MOS transistor MP12 within the differential transistor pair DF11; the current through the first P-channel MOS transistor MP11 is nil. Correspondingly, the bias current I2 flows only through the N-channel MOS transistor MN11 within the differential transistor pair DF12, and the current through the N-channel MOS transistor MN12 is nil.

In this case, each current mirror circuit operates as follows. The current mirror circuit CM13 develops an output current having a level identical to that of the bias current $I_2$, since the N-channel MOS transistor MN11 allows the bias current $I_2$ to be drawn from the input of the current mirror circuit CM13; it should be noted that the circle attached to each of the blocks referred to as each current mirror circuit represents the input terminal. The second current mirror circuit CM12 receives an input current which is the drain current I1 of the second P-channel MOS transistor MP12 and the output current I2 of the third current mirror circuit CM13 added together. The current mirror circuit CM12 is designed to have a mirror ratio of k; that is, the current mirror circuit CM12 develops an output current having a current level of k times of that of the input current inputted thereto. Therefore, the output current $I_{O(CM12)}$ of the current mirror circuit CM12 is represented by the following formula:

$$I_{O(CM12)} = k(I_1 + I_2) \quad (9)$$

On the other hand, the input current of the current mirror circuit CM14 is nil, since the current through the N-channel MOS transistor MN12 is nil. This results in that the output current of the current mirror circuit CM14 is set nil. Additionally, the current mirror circuit CM11 receives an input current which is the output current of the current mirror circuit CM14 and the drain current of the P-channel MOS transistor MP11 added together. The output current of the current mirror circuit CM14 and the drain current of the P-channel MOS transistor MP11 are both nil, and therefore the input current of the current mirror circuit CM11 is also nil. Accordingly, the output current of the current mirror circuit CM11 is set nil. Since the output current of the current mirror circuit CM11 is nil, the input current of the current mirror circuit CM15 is nil, and therefore the output current of the current mirror circuit CM15 is also nil.

As is understood from the foregoing, the differential amplifier circuit operates to draw a current from the output terminal OUT due to the operation of the current mirror circuit CM12. The current level $I_{OUT}$ on the output terminal OUT is represented by the following formula:

$$I_{OUT} = k(I_1 + I_2) \quad (10)$$

This results in that the voltage level on the output terminal OUT is pulled down to the low level (GND).

(1-b) Operation for Vin⁻<Vin⁺

Next, a description is given for a case where the input voltage Vin⁺ is higher than the input voltage Vin⁻, and the difference between the input voltages Vin⁺ and Vin⁻ is equal to or above the value defined by Formula (7). In this case, the differential amplifier circuit performs the comparator circuit operation, and therefore the bias current I₁ flows only through the P-channel MOS transistor MP11 within the differential transistor pair DF11, and the current through the P-channel MOS transistor MP12 is set nil. Correspondingly, the bias current I₂ flows only through the N-channel MOS transistor MN12 within the differential transistor pair DF12, and the current through the N-channel MOS transistor MN11 is set nil.

In this case, each current mirror circuit operates as follows. The current mirror circuit CM14 develops an output current having a level identical to that of the bias current I₂, since the N-channel MOS transistor MN12 allows the bias current I₂ to be drawn from the input of the current mirror circuit CM14. The current mirror circuit CM11 receives an input current which is the drain current I1 of the P-channel MOS transistor MP11 and the output current I2 of the current mirror circuit CM14 added together Therefore, the output current $I_{O(CM11)}$ of the current mirror circuit CM11 is represented by the following formula:

$$I_{O(CM11)} = I_1 + I_2 \tag{11}$$

The output of the current mirror circuit CM11 is connected with the input of the current mirror circuit CM15, and therefore the input current of the current mirror circuit CM15 is (I₁+I₂). The current mirror circuit CM15 is designed to have a mirror ratio of k, that is, the current mirror circuit CM15 develops an output current having a current level of k times of that of the input current inputted thereto. Therefore, the output current $I_{O(CM15)}$ of the current mirror circuit CM15 is represented by the following formula:

$$I_{O(CM15)} = k(I_1 + I_2) \tag{12}$$

On the other hand, the input current of the current mirror circuit CM13 is nil, since the drain current of the N-channel MOS transistor MN11 is set nil. Therefore, the output current of the current mirror circuit CM13 is also set nil. The current mirror circuit CM12 receives an input current which is the output current of the current mirror circuit CM13 and the drain current of the P-channel MOS transistor MP12 added together. Since these currents are both nil, the input current of the current mirror circuit CM12 is nil, and the output current thereof is also set nil.

From the foregoing, the differential amplifier circuit operates to supply a current from the output terminal OUT due to the operation of the current mirror circuit CM15. The current $I_{OUT}$ developed on the output terminal OUT is represented by the following formula:

$$I_{OUT} = k(I_1 + I_2) \tag{13}$$

This results in that the voltage level on the output terminal OUT is pulled up to the high level ($V_{DD}$).

In summary, the differential amplifier circuit operates to draw or supply a current through the output terminal $I_{OUT}$ in response to the voltage level difference between the inverting input terminal In⁻ and the non-inverting input terminal In⁺, when both the first differential transistor pairs DF11 and DF12 are activated. The current level on the output terminal OUT is represented by formulas (10) and (13).

(2) In Case where Only First Differential Transistor Pair DF11 is Activated

Only the first differential transistor pair DF11 is activated when the input voltages Vin⁻ and $V_{in}^+$ satisfy conditions defined by the following formulas:

$$0 < V_{in} < V_{GS(MN)} + V_{DS(sat)(I12)} \tag{14}$$

where $V_{GS(MN)}$ is the gate-source voltage of the N-channel MOS transistors MN11 or MN12, and $V_{DS(sat)(I12)}$ is the drain-source voltage at saturation of the N-channel MOS transistor (not shown) within the current source I12.

In such input voltage range, a sufficient drain-source voltage is not established across the MOS transistor within the constant current source I12, and therefore the bias current I2 is set nil. As a result, the differential transistor pair DF12 is deactivated.

(2-a) Operation for Vin⁻>Vin⁺

First, a description is given for a case where the input voltage Vin⁻ is higher than the input voltage Vin⁺, and the voltage difference between the input voltages Vin⁻ and Vin⁺ are equal to or above the minimum voltage difference ΔVid defined by formula (7). Under these conditions, the bias current I1 flows only through the P-channel MOS transistor MP12 within the differential transistor pair DF11, and therefore the current through the first P-channel MOS transistor MP11 is nil. Additionally, the bias current I2 through the differential transistor pair DF12 is nil.

In this case, each current mirror circuit operates as follows: No electric current flows through the current mirror circuits CM13 and CM14, since the bias current I2 is nil. The input current of the current mirror circuit CM11 is set nil, since the output current of the current mirror circuit CM14 and the drain current of the P-channel MOS transistor MP11 are nil. Therefore, the output current of the current mirror circuit CM11, which is identical to the input current of the current mirror circuit CM15, is also set nil. Because the input current of the current mirror circuit CM15 is nil, the output current thereof is also set nil.

The current mirror circuit CM12, on the other hand, receives the drain current of the P-channel MOS transistor MP12 within the differential transistor pair DF11, while the output current of the current mirror circuit CM13 is nil. That is, the input current of the current mirror circuit CM12 is identical to the drain current I1 of the P-channel MOS transistor MP12, and therefore the current mirror circuit CM12 develops an output current having a current level of k times of that the input current. Accordingly, the differential amplifier circuit operates to draw a current from the output terminal OUT due to the operation of the current mirror circuit CM12. The current level $I_{OUT}$ on the output terminal OUT is equal to k·I₁, and the output voltage on the output terminal OUT is pulled down to the low level (GND).

(2-b) Operation for Vin⁻<Vin⁺

Next, a description is given for a case where the voltage Vin⁺ is higher than the voltage Vin⁻, and the voltage difference between the voltages Vin⁺ and Vin⁻ is equal to or above the minimum voltage difference defined by formula (7). Under these conditions, the bias current I1 flows only through the P-channel MOS transistor MP11 within the differential transistor pair DF11, and the current through the P-channel MOS transistor MP12 is nil. Additionally, the bias current I2 of the differential transistor pair DF12 is nil.

In this case, each current mirror circuit operates as follows: No electric current flows through the current mirror circuits CM13 and CM14, since the bias current I2 of the differential transistor pair DF12 is nil. Since the output current of the current mirror circuit CM13 and the drain current of the P-channel MOS transistor MP12 are both nil, the input current of the current mirror circuit CM12 is also nil, and the output current of the current mirror circuit CM12 is set nil.

The current mirror circuit CM11, on the other hand, receives the drain current of the P-channel MOS transistor MP11 within the differential transistor pair DF11, while the output current of the current mirror circuit CM14 is nil. That is, the input current of the current mirror circuit CM11 is identical to the drain current I1 of the P-channel MOS transistor MP11, and the current mirror circuit CM11 develops an output current having a current level identical to that of the input current I1, which is to be supplied to the input of the current mirror circuit CM15.

The current mirror circuit CM15 receives the output current of the current mirror circuit CM11 on the input, and therefore develops an output current having a current level of k times of that of the input current inputted thereto. The differential amplifier circuit supplies a current from the output terminal OUT due to the operation of the current mirror circuit CM15. The current level $I_{OUT}$ on the output terminal OUT is equal to $k \cdot I_1$. This results in that the voltage level on the output terminal OUT is pulled up to the high level ($V_{DD}$).

In summary, the differential amplifier circuit operates to draw or supply a current through the output terminal OUT in response to the input voltage difference between the inverting input terminal In⁻ and the non-inverting input terminal In⁺. The current level on the output terminal OUT is represented by the following formula in the both cases:

$$I_{OUT} = kI_1 \quad (15)$$

(3) In Case where Only the Second Differential Transistor Pair DF12 is Activated Only the second differential transistor pair DF12 is activated in a case where the input voltages Vin⁻ and Vin⁺ satisfy conditions defined by the following formulas:

$$V_{DD} > V_{in} > V_{DD} - (V_{GS(MP)} + V_{DS(sat)(I11)}) \quad (16)$$

where $V_{GS(MP)}$ is the gate-source voltage of the P-channel MOS transistors MP11 or MP12, and $V_{DS(sat)(I11)}$ is the drain-source voltage at saturation of the P-channel MOS transistor (not shown) within the current source I11.

In such input voltage ranges, a sufficient drain-source voltage is not established across the MOS transistor within the constant current source I12, and therefore the bias current I2 is set nil. As a result, the differential transistor pair DF11 is deactivated.

The current level on the output terminal OUT is correspondingly obtained through the same analysis as the forgoing, and the current level $I_{OUT}$ on the output terminal OUT is represented by the following formula in any case where the differential amplifier circuit operates to draw or supply a current through the output terminal:

$$I_{OUT} = kI_2 \quad (17)$$

The above-described analysis proves that the drive capability of the differential amplifier circuit directly depends on the bias currents fed to the differential transistor pair; increasing the drive capability requires increasing the bias currents. Additionally, the drive current developed on the output terminal is used for charging or discharging the load capacitance connected with the output terminal OUT of the differential amplifier circuit. Therefore, the operation speed of the differential amplifier circuit depends on the bias currents. In other words, enhancing the operation speed of the differential amplifier circuit requires Next, power consumption of the differential amplifier circuit shown in FIG. 1 is analyzed in the following.

When the input voltage Vin⁻ is higher than the input voltage Vin⁺, and the difference between the input voltages Vin⁻ and Vin⁺ are equal to or above the minimum voltage difference ΔVid defined by formula (7), the power source $V_{DD}$ provides the constant current source I11 with the bias current having a current level of $I_1$, and also provides the common terminal of the current mirror circuit CM13 with a current having a current value of 2·I2. Therefore, the total static power consumption $P_{(Total)}$ is represented by the following formula, if the current through the output terminal OUT is ignored:

$$P_{(Total)} = V_{DD}(I_1 + 2I_2) \quad (18)$$

On the other hand, when the input voltage Vin⁻ is lower than the input voltage Vin⁺, and the difference between the input voltages Vin⁻ and Vin⁺ is equal to or above the minimum voltage difference ΔVid defined by formula (7), the power source $V_{DD}$ provides the constant current source I11 with the bias current having the current level of I1, the common terminal of the current mirror circuit CM14 with a current having the current level of 2·I2, and the input terminal of the current mirror circuit CM15 with a current having the current level of I1+I2. Therefore, the total static power consumption $P_{(Total)}$ is represented by the following formula, if the current through the output terminal OUT is ignored:

$$P_{(Total)} = V_{DD}(2I_1 + 3I_2) \quad (19)$$

The conventional differential amplifier shown in FIG. 1 suffers from various drawbacks. Firstly, enhancing the operating speed requires increasing the bias currents developed by the constant current sources I11 and I12.

Additionally, the circuit architecture of the conventional differential amplifier is complicated; for example, two sets of differential transistors pairs DF11 and DF12 within the conventional differential amplifier necessitates performing an increased number of current mirroring steps.

Furthermore, an increased number of the current mirror circuits develop output currents in response to the bias currents distributed by the constant current sources I11 and I12, and this undesirably increases the power consumption.

Additionally, there are different numbers of transistors along a signal path from the differential transistor pair DF11 to the output terminal OUT, and along another signal path from the differential transistor pair DF12 to the output terminal OUT. That is, the signal path from the differential transistor pair DF12 requires additional one current mirroring step by using the current mirror circuits CM13 or CM14 to develop the output current to be added to the output current associated with the differential transistor pair DF11. In other words, the signal path from the differential transistor pair DF12 to the output terminal OUT is long compared to that from the differential transistor pair DF11. This implies that the conventional differential amplifier circuit exhibits different characteristics in the cases where only the differential transistor pair DF11 is activated and where only the differential transistor pair DF12 is activated.

SUMMARY OF THE INVENTION

In an aspect of the present invention, a voltage comparator circuit is composed of a differential amplifier circuit receiving a pair of input signals to develop an output signal on an output terminal, and a waveform shaping circuit achieving waveform shaping of the output signal received from the differential amplifier circuit. The differential amplifier circuit includes: a first differential transistor pair responsive to the pair of input signals to output first and second output currents; a second differential transistor pair complementary to the first differential transistor pair, and responsive to the pair of input signals to output third and fourth output currents; a first current mirror circuit developing a first internal current in response to the first output current; a third current mirror circuit complementary to the first current mirror circuit and developing a third internal current in response to the third output current; a second current mirror circuit developing a second internal current in response to the third output current and the third internal current; and a fourth current mirror circuit complementary to the first current mirror circuit and developing a fourth internal current in response to the fourth output current and the first internal current. A resultant current which is said second and fourth currents added together is drawn from or supplied to the output terminal of the differential amplifier circuit.

In the voltage comparator circuit thus constructed, the number of circuit elements along a first signal path from the first differential transistor pair to the output terminal is allowed to be identical to that along a second signal path from the second differential transistor pair to the output terminal. Such architecture effectively improves circuit symmetry, and thereby enhances the performance of the voltage comparator circuit.

BRIEF DESCRIPTION OF THE DRAWINGS

The above and other advantages and features of the present invention will be more apparent from the following description taken in conjunction with the accompanied drawings, in which.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

Figure 4:
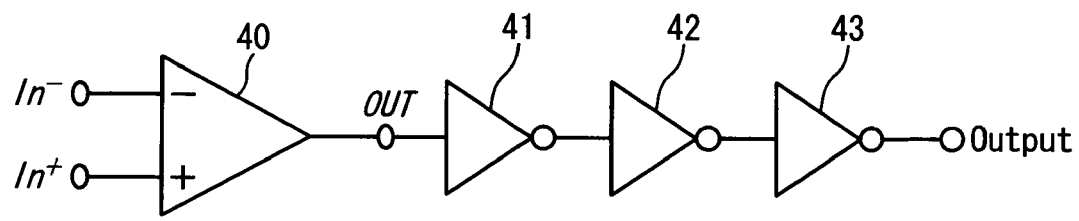
FIG. 4 is a circuit diagram illustrating an exemplary structure of a voltage comparator circuit incorporating a differential amplifier circuit in one embodiment of the present invention.

The design of the voltage comparator circuit according to the present invention is based on the analysis of the conventional differential amplifier circuit. In one embodiment, as shown in FIG. 4, a voltage comparator circuit is composed of a differential amplifier circuit 40 and a set of CMOS inverters 41 to 43. The CMOS inverters 41 to 43 are serially-connected to the output of the differential amplifier circuit 40. The serially-connected CMOS inverters 41 to 43 are used for waveform shaping. The CMOS inverter 43 functions as an output stage of the voltage comparator circuit.

Figure 5:
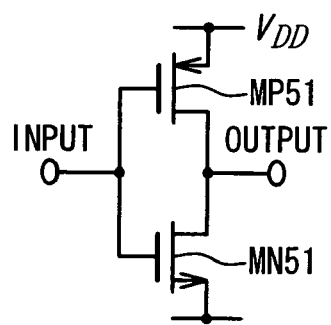
FIG. 5 illustrates a circuit structure example of a CMOS inverter.

An exemplary circuit configuration of the CMOS inverters 41 to 43 is shown in FIG. 5. With reference to FIG. 5, the CMOS inverters 41 to 43 are each provided with an N-channel MOS transistor MN51 and a P-channel MOS transistor MP51. The gates of the N-channel MOS transistor MN51 and the P-channel MOS transistor MP51 are commonly connected to the input terminal, and the drains thereof are commonly connected to the output terminal. The source of the P-channel MOS transistor MP51 is connected to a power source $V_{DD}$ (or a $V_{DD}$ terminal), and the source of the N-channel MOS transistor MN51 is connected to an earth terminal $V_{SS}$ (or a $V_{SS}$ terminal)

Figure 6:
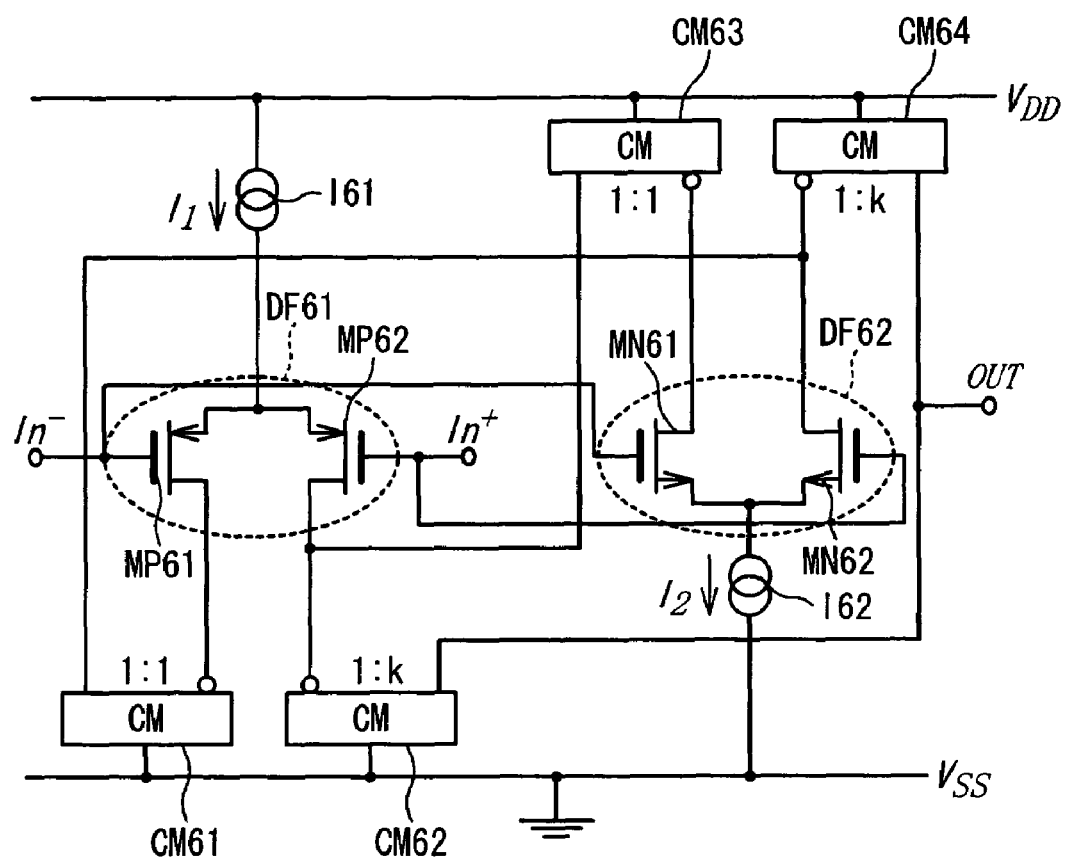
FIG. 6 illustrates a circuit diagram illustrating an exemplary circuit structure of a differential amplifier circuit according to the present invention.

FIG. 6 is a circuit diagram illustrating a circuit structure of the differential amplifier circuit 40 according to the present invention. The differential amplifier circuit 40 is provided with a first differential transistor pair DF61 having P-channel MOS transistors MP61 and MP62; a second differential transistor pair DF62 having N-channel MOS transistors MN61 and MN62; first to fourth current mirror circuits CM61 to CM64; and constant current sources I61 and I62.

The current mirror circuit CM61 has an input terminal connected to the drain of the P-channel MOS transistor MP61 within the differential transistor pair DF61, a common terminal connected to the earth terminal (or the $V_{SS}$ terminal), and an output terminal connected to the input terminal of the current mirror circuit CM64.

The current mirror circuit CM62 has an input terminal connected to the drain of the P-channel MOS transistor MP62 of the differential transistor pair DF61, a common terminal connected to the negative power source VSS (GND), and an output terminal connected to the output terminal OUT of the differential amplifier.

The current mirror circuit CM63 has an input terminal connected to the drain of the N-channel MOS transistor MN61 of the differential transistor pair DF62; a common terminal connected to the power supply terminal (or the $V_{DD}$ terminal); and an output terminal connected to the drain of the P-channel MOS transistor MP62 and also to the input terminal of the current mirror circuit CM62.

The current mirror circuit CM64 has an input terminal connected to the output of the current mirror circuit CM61 and also to the drain of the N-channel MOS transistor MN62 of the differential transistor pair DF62; a common terminal connected to the power supply terminal; and an output terminal connected to the output terminal of the current mirror circuit CM62, and also to the output terminal OUT of the differential amplifier circuit.

The constant current source I61 is connected between the $V_{DD}$ terminal and the commonly-connected sources of the P-channel MOS transistors MP61 and MP62. On the other hand, the constant current source I62 is connected between the $V_{SS}$ terminal and the commonly-connected sources of the N-channel MOS transistors MN61 and MN62.

In the differential amplifier circuit, the gates of the P-channel MOS transistor MP61 and the N-channel MOS transistor MN61 are commonly connected to an inverting input terminal In⁻, and the gates of the P-channel MOS transistor MP62 and the N-channel MOS transistor MN62 are commonly connected to a non-inverting input terminal In⁺. The differential amplifier circuit adopts the circuit architecture incorporating two complementary differential transistor pairs, and thereby enlarges the allowable input voltage range approximately between the voltage levels $V_{SS}$ and $V_{DD}$.

The current mirror circuits CM61 and CM62 provide current mirroring for the respective drain outputs of the differential transistor pair DF61. Correspondingly, the current mirror circuits CM63 and CM64 provide current mirroring for the respective drain outputs of the differential transistor pair DF62. The output of the current mirror circuit CM61 is connected to the input of the current mirror circuit CM64. The output of the current mirror circuit CM63 is connected to the input of the current mirror circuit CM62. The outputs of the current mirror circuits CM62 and CM64 are commonly connected to the output terminal OUT.

The current mirror circuits CM62 and CM64 are designed to have a mirror ratio of k (>1); the ratio of the input current to the output current is 1:k within the current mirror circuits CM62 and CM64. Setting the mirror ratio k to a value larger than one effectively improves the drive capability of the differential amplifier circuit. In addition, the circuit architecture effectively improves symmetry of the circuit characteristics, in which the number of circuit stages along the signal path associated with the P-channel differential transistor pair is the same as that associated with the P-channel differential transistor pair is same.

Operation of the differential amplifier circuit shown in FIG. 6 is described below. The circuit shown in FIG. 6 adopts the rail-to-rail differential amplifier architecture. The differential amplifier circuit in this embodiment operates differently depending on the voltage levels of the input voltages, especially, in terms of operations of the constant current sources I61 and I62.

In order to activate the constant current source I61, it is necessary to establish a sufficient drain-source voltage across a P-channel MOS transistor (not shown) within the constant current source I61. In order to achieve this, the input voltages Vin⁻ and Vin⁺ of the inverting and non-inverting input terminals In⁻ and In⁺ are required to satisfy the following formula:

$$\text{Vin} < V_{DD} - (V_{GS(MP)} + V_{DS(sat)(I61)}),$$

where Vin is any of the input voltages Vin⁻ and Vin⁺, $V_{DS(sat)(I61)}$ is the drain-source voltage at saturation of the P-channel MOS transistor within the constant current source I61, and $V_{GS(MP)}$ is the gate-source voltage of the P-channel MOS transistors MP61 or MP62.

Correspondingly, in order to activate the constant current source I62, it is necessary to establish a sufficient drain-source voltage across an N-channel MOS transistor (not shown) within the constant current source I62. The input voltages Vin⁻ and Vin⁺ of the inverting and non-inverting input terminals In⁻ and In⁺ are required to satisfy the following formula:

$$\text{Vin} > V_{GS(MN61)} + V_{DS(sat)(I62)},$$

where $V_{DS(sat)(I62)}$ is the drain-source voltage at saturation of the N-channel MOS transistor within the constant current source I62, and $V_{GS(MN)}$ is the gate-source voltage of the N-channel MOS transistors MN61 or MN62.

In other words, both of the differential transistor pairs DF61 and DF62 are activated when it holds:

$$V_{GS(MN)} + V_{DS(sat)(I62)} < \text{Vin}^- < V_{DD} - (V_{GS(MP)} + V_{DS(sat)(I61)}).$$

Additionally, only the differential transistor pair DF62 is activated with the differential transistor pair DF61 deactivated, when it holds:

$$\text{Vin} > V_{DD} (V_{GS(MP61)} + V_{DS(sat)(I61)}).$$

Finally, only the differential transistor pair DF61 is activated with the differential transistor pair DF62 deactivated, when it holds:

$$\text{Vin} < V_{GS(MN)} + V_{DS(sat)(I62)}.$$

(1) In Case where Both the First and Second Differential Transistor Pairs DF61 and DF62 are Activated A description of the operation of the differential amplifier circuit in this embodiment is given for a case where the input voltage Vin⁻ is higher than the input voltage Vin⁺, and the voltage difference between the input voltages Vin⁻ and Vin⁺ is equal to or above the minimum voltage difference ΔVid defined by formula (7) with both of the differential transistor pairs DF61 and Df62 activated.

In this case, the bias current I1 flows only through the P-channel MOS transistor MP62 within the first differential transistor pair DF61, and the current through the P-channel MOS transistor MP61 is set nil. On the other hand, the bias current I2 flows only through the N-channel MOS transistor MN61 within the second differential transistor pair DF62, and the current through the N-channel MOS transistor MN62 is set nil.

In this operation, each current mirror circuit operates as follows. The output current of the current mirror circuit CM61 is set nil since the input terminal of the current mirror circuit CM61 is connected with the drain of the P-channel MOS transistor MP61, and the drain current thereof is nil. The input terminal of the current mirror circuit CM63 is connected to the drain of the N-channel MOS transistor MN61. The drain current of the N-channel MOS transistor MN61 is set to I2, and therefore an output current $I_{OUT(CM63)}$ of the current mirror circuit CM63 is also set to I2.

The input terminal of the current mirror circuit CM62 is connected with the drain of the P-channel MOS transistor MP62 and also with the output terminal of the current mirror circuit CM63. Since the drain current of the P-channel MOS transistor MP62 is I1 and the output current of the current mirror circuit CM63 is I2, the current mirror circuit CM62 receives a current (I1+I2) on the input terminal thereof. In addition, since the mirror ratio of the current mirror circuit CM62 is k, the output current $I_{OUT(CM62)}$ of the current mirror circuit CM62 is represented by the following formula:

$$I_{OUT(CM62)} = k(I_1 + I_2) \qquad (20)$$

In other words, the current mirror circuit CM62 draws the output current $I_{OUT(CM62)}$ through the output terminal thereof, and the voltage level on the output terminal is pulled down to the low level, namely, to the potential level $V_{SS}$.

The input terminal of the current mirror circuit CM64 is connected with the drain of the N-channel MOS transistor MN62 and also with the output terminal of the current mirror circuit CM61. Since the drain current of the N-channel MOS transistor MN62 and the output current of the current mirror circuit CM61 are both nil, the output current of the current mirror circuit CM64 is also nil.

Therefore, the differential amplifier circuit in this embodiment draws a current having a current level of k·(I1+I2) from the output terminal OUT, and the voltage level on the output terminal is pulled down to the low level, namely, to the potential level $V_{SS}$.

Next, a description is made for a case where the input voltage Vin⁻ is lower than the input voltage Vin⁺, and the difference between the input voltages Vin⁻ and Vin⁺ is equal to or above the minimum voltage difference ΔVid defined by formula (7).

In this case, the bias current I1 flows only through the P-channel MOS transistor MP61 within the first differential transistor pair DF61, and the current through the P-channel MOS transistor MP62 is set nil. On the other hand, the bias current I2 flows only through the N-channel MOS transistor MN62 within the second differential transistor pair DF62, and the current through the N-channel MOS transistor MN61 is set nil.

In this case, each current mirror circuit operates as follows. The drain current of the P-channel MOS transistor MP61 is I1, and the drain thereof is connected with the input terminal of the current mirror circuit CM61. Therefore, the output current of the first current mirror circuit CM61 is also I1.

The drain current of the current mirror circuit CM63 is nil, and the drain thereof is connected with the input terminal of the current mirror circuit CM63. Therefore, the output current of the third current mirror circuit CM63 is also nil. The second current mirror circuit CM62 receives an input current which is the drain current of the P-channel MOS transistor MP62 and the output current of the third current mirror circuit CM63 added together. Since these currents are both nil, the input current and the output current of the second current mirror circuit CM62 are both nil.

The input terminal of the fourth current mirror circuit CM64 is connected to the drain of the N-channel MOS transistor MN62, and also to the output terminal of the first current mirror circuit CM61. The fourth current mirror circuit CM64 receives an input current having a current level of (I2+I1), which is the drain current of the N-channel MOS transistor MN62 and the output current of the first current mirror circuit CM61 added together. Since the fourth current mirror circuit CM64 has a mirror ratio of k, an output current $I_{OUT(CM64)}$ of the fourth current mirror circuit CM64 is represented by the following formula:

$$I_{OUT(CM64)} = k(I_1 + I_2) \quad (21)$$

Therefore, the differential amplifier circuit supplies the current $I_{OUT}$(=k(I2+I1)) from the output terminal OUT thereof, and the voltage level of the output terminal OUT is pulled up to the high level, namely, to the power supply level VDD.

As is understood from formulas (20) and (21), the current level of the pull-down current is identical to that of the pull-up current on the output terminal OUT. Therefore, rising and falling edges are shaped in a symmetry manner even when the output terminal is connected with an increased load capacitance. This advantageously helps the voltage comparator to develop a digital signal having a duty ratio of 50% through waveform shaping.

The above-mentioned is the description for the case where both the differential transistor pairs DF61 and DF62 are activated. Decrease in a common-mode signal voltage of the input differential signals results in that the differential transistor pair DF62, which consists of the N-channel transistors, is deactivated. Increase in the common-mode signal voltage of the input differential signals, on the other hand, the differential transistor pair DF61, which consists of the P-channel transistors, is deactivated. Operations in these respective cases are described in the following.

(2) In Case where Only the First Differential Transistor Pair DF61 is Activated

First, a description is made of a case where the common-mode signal voltage of the input differential signals is decreased so that only the first differential transistor pair DF61 is activated with the second differential transistor pair DF62 deactivated.

Referring to FIG. 6, the constant current source I62, which provides the bias current I2 for the N-channel differential transistor pair DF62, is composed of an N-channel MOS transistor. The bias current I2 is controlled to a desired current level by controlling the voltage level on the gate of this N-channel MOS transistor.

In this case, the minimum input voltage Vin(min) at which the N-channel differential transistor pair DF62 is activated is represented by the following formula:

$$V_{in(min.)} = V_{GS(MN)} + V_{DS(sat)(I62)} \quad (22)$$

Where $V_{GS(MN)}$ is the gate-source voltage of the N-channel MOS transistor MN61 or MN62, and $V_{DS(sat)(I62)}$ is the drain-source voltage at saturation point of the N-channel MOS transistor within the constant current source I62. The drain-source voltage at saturation of the N-channel MOS transistor is defined as a voltage barely enough to operate in the pentode region.

The N-channel differential transistor pair DF62 is deactivated when any of the input voltages is equal to or below Vin(min); in this case only the P-channel differential transistor pair DF61 is activated.

First, a description is made of a case where the input voltage Vin⁻, which is the input voltage of the inverting input terminal In⁻, is higher than that of the input voltage Vin⁺, which is the input voltage of the non-inverting input terminal In⁺, with only the P-channel differential transistor pair DF61 activated In this case, the bias current I1 flows only through the second P-channel MOS transistor MP62 within the first differential transistor pair DF61, and the current through the first P-channel MOS transistor MP61 is set nil. On the other hand, the second differential transistor pair DF62 is deactivated, and therefore the drain currents of the first and second N-channel MOS transistors MN61 and MN62 are both set nil.

In this case, each current mirror circuit operates as follows. Since the second differential transistor pair DF62 is deactivated, the input current of the third current mirror circuit CM63 connected to the second differential transistor pair DF62 is nil. Therefore, the output current of the current mirror circuit CM63 is nil. The input current of the current mirror circuit CM64 is also nil, because the drain current of the N-channel MOS transistor MN62 is nil.

The input current of the first current mirror circuit CM61, having the input terminal connected to the drain of the first P-channel MOS transistor MP61, is nil, and therefore the output current thereof is consequently nil. Therefore, the input current of the current mirror circuit CM64, which is output current of the current mirror circuit 61 and the drain current of the N-channel MOS transistor MN62 added together, is nil. Accordingly, the output current of the current mirror circuit CM64 is also set nil.

The input current of the second current mirror circuit CM62 is identical to the drain current of the P-channel MOS transistor MP62, because the input terminal of the second current mirror circuit CM61 is connected to the drain of the P-channel MOS transistor MP62 and also to the output terminal of the third current mirror circuit CM63, and the output current of the third current mirror circuit CM63 is nil. Therefore, the output current $I_{OUT(CM62)}$ of the second current mirror circuit CM62 is represented by the following formula:

$$I_{OUT(CM62)} = kI_1 \qquad (23)$$

In other words, the differential amplifier circuit 40 draws the current $I_{OUT}(=k \cdot I1)$ from the output terminal OUT. The voltage level on the output terminal OUT is pulled down to the low level, that is, to the earth level $V_{SS}$.

Next, a description is made of a case where the input voltage Vin⁻ is lower than the input voltage Vin⁺. When the difference of the input voltages Vin⁻ and Vin⁺ is larger than the minimum voltage difference ΔVid defined by formula (7), the bias current I1 flows only through the first P-channel MOS transistor MP61 within the first differential transistor pair DF61, and the current through the second P-channel MOS transistor MP62 is nil. On the other hand, the second differential transistor pair DF62 is deactivated, and thus the drain currents of the first N-channel MOS transistor MN61 and the second N-channel MOS transistor MN62 are set nil.

In this case, each current mirror circuit operates as follows. Since the second differential transistor pair DF62 is deactivated, the input current of the third current mirror circuit CM63, having the input terminal connected to the second differential transistor pair DF62, is set nil. Therefore, the output current of the third current mirror circuit CM63 is nil. Also, the input current of the current mirror circuit CM64 is nil, because the input terminal of the current mirror circuit CM64 is connected to the drain of the N-channel MOS transistor MN62 with the drain current thereof being nil.

The input current of the first current mirror circuit CM61, having the input terminal connected to the drain of the first P-channel MOS transistor MP61, has a current level of I1, being identical to the drain current of the P-channel MOS transistor MP61, and the output current of the first current mirror circuit CM61 consequently has a current level of I1.

The input current of the second current mirror circuit CM62, having the input terminal connected to the drain of the second P-channel MOS transistor MP62 and the output terminal of the third current mirror circuit CM63, is set nil, since both of the drain current of the second P-channel MOS transistor MP62 and the output current of the third current mirror circuit CM63 are nil. Therefore, the output current of the second current mirror circuit CM62 is also set nil.

The input current of the fourth current mirror circuit CM64, having the input terminal connected to the drain of the second N-channel MOS transistor MN62 and the output terminal of the first current mirror circuit CM61, has a current level of I1, since the drain current of the second N-channel MOS transistor MN62 is nil and the output current of the first current mirror circuit CM61 has a current level of I1. Additionally, the fourth current mirror circuit CM64 has a mirror ratio of k. Therefore, the output current $I_{OUT(CM64)}$ of the fourth current mirror circuit CM64 is represented by the following formula:

$$I_{OUT(CM64)} = kI_1 \qquad (24)$$

In this operation, the differential amplifier circuit 40 supplies the current $I_{OUT}(=k \cdot I1)$ from the output terminal OUT. The voltage level on the output terminal OUT is pulled up to the high level, that is, to the power supply level $V_{DD}$.

As is understood from formulas (23) and (24), the current level of the pull-down current is identical to that of the pull-up current on the output terminal OUT. Therefore, rising and falling edges are shaped in a symmetry manner even when the output terminal is connected with an increased load capacitance. This advantageously helps the voltage comparator to develop a digital signal having a duty ratio of 50% through waveform shaping.

(3) In Case where Only the Second Differential Transistor Pair DF62 is Activated Next, a description is made of a case where the common-mode signal voltage of the input voltages Vin⁻ and Vin⁺ is increased so that the first differential transistor pair DF61 is deactivated with only the second differential transistor pair DF62 activated.

Referring to FIG. 6, the constant current source I61, which provides the bias current I1 for the P-channel differential transistor pair DF61, is composed of a P-channel MOS transistor. The bias current I1 is controlled to a desired current level by controlling the voltage level on the gate of this P-channel MOS transistor.

In this case, a maximum input voltage Vin(max) at which the P-channel differential transistor pair DF61 is activated is represented by the following formula:

$$V_{in(max.)} = V_{DD} - (V_{GS(MP)} + V_{DS(sat)(I61)}) \qquad (25)$$

where $V_{GS(MP)}$ is the gate-source voltage of the P-channel MOS transistors MP61 or MP62, and $V_{DS(sat)(I61)}$ is the drain-source voltage at saturation of the P-channel MOS transistor within the constant current source I61. The drain-source voltage at saturation of the P-channel MOS transistor is defined as a voltage barely enough to operate in the pentode region.

The P-channel differential transistor pair DF61 is deactivated when any of the input voltages is equal to or above Vin(max); in this case only the N-channel differential transistor pair DF62 is activated.

Firstly, a description is made of a case where the input voltage Vin⁻ is higher the input voltage Vin⁺ with only the N-channel differential transistor pair DF62 activated. In this case, the bias current I2 flows only through the N-channel MOS transistor MN61 within the second differential transistor pair DF62, and the current through the second N-channel MOS transistor MN62 is set nil. On the other hand, the first differential transistor pair DF61 is deactivated, and therefore the drain currents of the first P-channel MOS transistor MP61 and the second P-channel MOS transistor MP62 are nil.

In this case, each current mirror circuit operates as follows. Since the first differential transistor pair DF61 is deactivated, the input current of the first current mirror circuit CM61, having the input terminal connected to the first differential transistor pair DF61, is nil. Therefore, the output current of the current mirror circuit CM61 is set nil. The input current of the third current mirror circuit CM63, having the input terminal connected to the drain of the first N-channel MOS transistor MN1, has a current level of I2, since the drain current of the first N-channel MOS transistor MN1 has a current level of I2. Therefore, the output current of the third current mirror circuit CM63 also has a current level of I2.

The input terminal of the second current mirror circuit CM62 is connected to the output terminal of the third current mirror circuit CM63, and also to the drain of the second P-channel MOS transistor MP62. The P-channel differential transistor pair MP61 is deactivated, and thus the drain current of the second P-channel MOS transistor MP62 is nil. Therefore, the input current of the second current mirror circuit CM62 has a current level of I2, and the current level $I_{OUT(CM62)}$ of the output current of the second current mirror circuit CM62 is represented by the following formula:

$$I_{OUT(CM62)} = kI_2 \qquad (26)$$

The input current of the fourth current mirror circuit CM64, having the input terminal connected to the drain of the second N-channel MOS transistor MN62 and the output terminal of the first current mirror circuit CM61, is nil, because the drain current of the second N-channel MOS transistor MN62 and the output current of the first current mirror circuit CM61 are both nil. Therefore, the output current of the fourth current mirror circuit is also nil.

Accordingly, the differential amplifier circuit 40 draws the output current $I_{OUT}(=k \cdot I2)$ from the output terminal OUT, and the voltage level on the output terminal OUT is consequently pulled down to the low level, that is, to the earth level $V_{SS}$.

Next, a description is made of a case where the input voltage Vin⁻ is lower than the input voltage Vin⁺ with only the second differential transistor pair DF62 activated. When the difference between the input voltages Vin⁻ and Vin⁺ is larger than the minimum voltage difference ΔVid defined by formula (7), the bias current I2 flows only through the second N-channel MOS transistor MN62 within the second differential transistor pair DF62, and the current through the first N-channel MOS transistor MN61 is set nil. On the other hand, the first differential transistor pair DF61 is deactivated, and therefore the drain currents of both of the first and second P-channel MOS transistors MP61 and MP62 are nil.

In this case, each current mirror circuit operates as follows. Since the first differential transistor pair DF61 is deactivated, the input current of the first current mirror circuit CM61 connected to the first differential transistor pair DF61 is nil. Therefore, the output current of the first current mirror circuit CM61 is nil.

Additionally, the input current of the third current mirror circuit CM63, having the input terminal connected to the drain of the first N-channel MOS transistor MN61, is set nil, since the drain current of the first N-channel MOS transistor MN61 is nil. Therefore, the output current of the third current mirror circuit CM63 is also set nil.

The input terminal of the second current mirror circuit CM62 is connected with the output terminal of the third current mirror circuit CM63 and the drain of the second P-channel MOS transistor MP62. Since the P-channel differential transistor pair DF61 is deactivated, the drain current of the second P-channel MOS transistor MP62 is nil. The output current of the third current mirror circuit CM63 is also nil. Therefore, the input current of the second current mirror circuit CM62 is nil, and the output current $I_{OUT(CM62)}$ thereof is consequently nil.

The input terminal of the fourth current mirror circuit CM64 is connected to the output terminal of the first current mirror circuit CM61 and the drain of the second N-channel MOS transistor MN62. Since the output current of the first current mirror circuit CM61 is nil and the drain current of the second N-channel MOS transistor MN62 has a current level of I2, the input current of the fourth current mirror circuit CM64 has a current level of I2. Additionally, the fourth current mirror circuit CM64 has a mirror ratio of k. Therefore, the output current $I_{OUT(CM64)}$ of the fourth current mirror circuit CM64 is represented by the following formula:

$$I_{OUT(CM64)} = kI_2 \qquad (27)$$

In other words, the differential amplifier circuit 40 supplies the current $I_{OUT}(=k \cdot I2)$ from the output terminal OUT. The voltage level on the output terminal OUT is pulled up to the high level, that is, to the power supply level $V_{DD}$.

As is understood from formulas (26) and (27), the current level of the pull-down current is identical to that of the pull-up current on the output terminal OUT. Therefore, rising and falling edges are shaped in a symmetry manner even when the output terminal is connected with an increased load capacitance. This advantageously helps the voltage comparator to develop a digital signal having a duty ratio of 50% through waveform shaping.

Thus, the current level of the pull-down current is identical to that of the pull-up current, even when the operations of the first differential transistor pair DF61 and the second differential transistor pair DF62 are switched. This allows the output digital signal to have a duty ratio of 50% after the waveform shaping due to the waveform symmetry.

A description is then given of analysis of the power consumption of the differential amplifier circuit 40 shown in FIG. 6. The analysis addresses a case where both of the differential transistor pairs DF61 and DF62 are activated.

When the input voltage Vin⁻ is higher than the input voltage Vin⁺, and the difference therebetween is equal to or above the minimum voltage difference ΔVid defined by formula (7), the current through the current mirror circuit CM64 is nil. The power supply $V_{DD}$ provides the first constant current source I61 with a current having a current level of I1, and the common terminal of the third current mirror circuit CM63 with a current having a current level of 2I2. Consequently, the total static power consumption $P_{(Total)}$ is represented by the following formula:

$$P_{(Total)} = V_{DD}(I_1 + 2I_2) \qquad (28)$$

It should be noted that the current through the output terminal OUT is ignored in this analysis.

On the other hand, when the input voltage Vin⁻ is lower than input voltage Vin⁺, and the difference between the input voltages Vin⁻ and Vin⁺ is equal to or above the minimum voltage difference ΔVid defined by formula (7), the current through the third current mirror circuit CM63 is nil. The power supply $V_{DD}$ provides the first constant current source I61 with a current having a current level of I1, and the input terminal of the fourth current mirror circuit CM4 with a current having a current level of I1+I2. It should be noted that the current through the output terminal of the fourth current mirror circuit CM4 is the current flowing outside from the output terminal OUT. Consequently, the total static power consumption $P_{(Total)}$ is indicated by the following formula:

$$P_{(Total)} = V_{DD}(2I_1 + I_2) \qquad (29)$$

It should be noted that the current through the output terminal OUT is ignored in this analysis.

Figure 1:
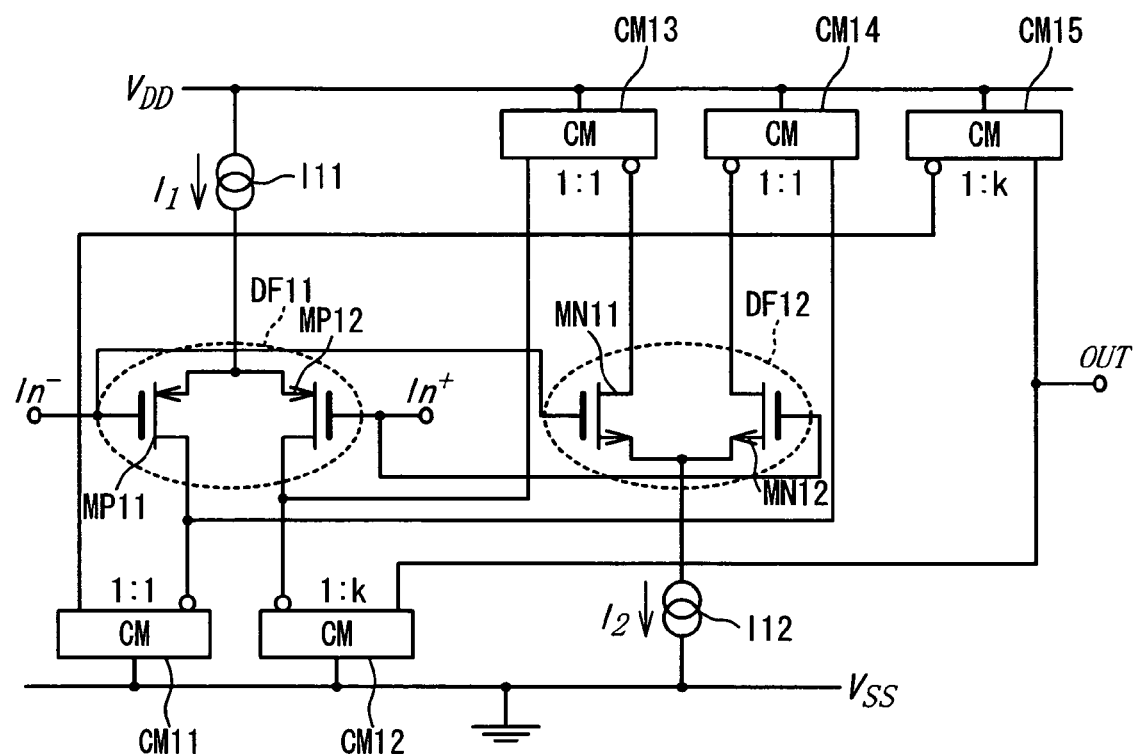
FIG. 1 shows a conventional differential amplifier circuit.
Figure 2:
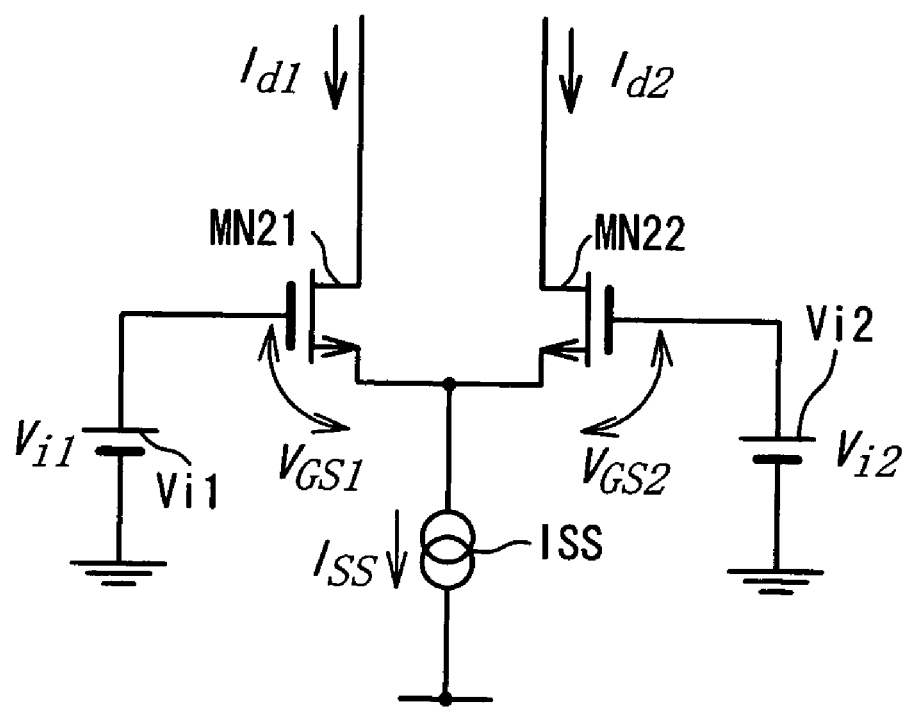
FIG. 2 is a circuit diagram illustrating an exemplary structure of a differential amplifier stage.
Figure 3:
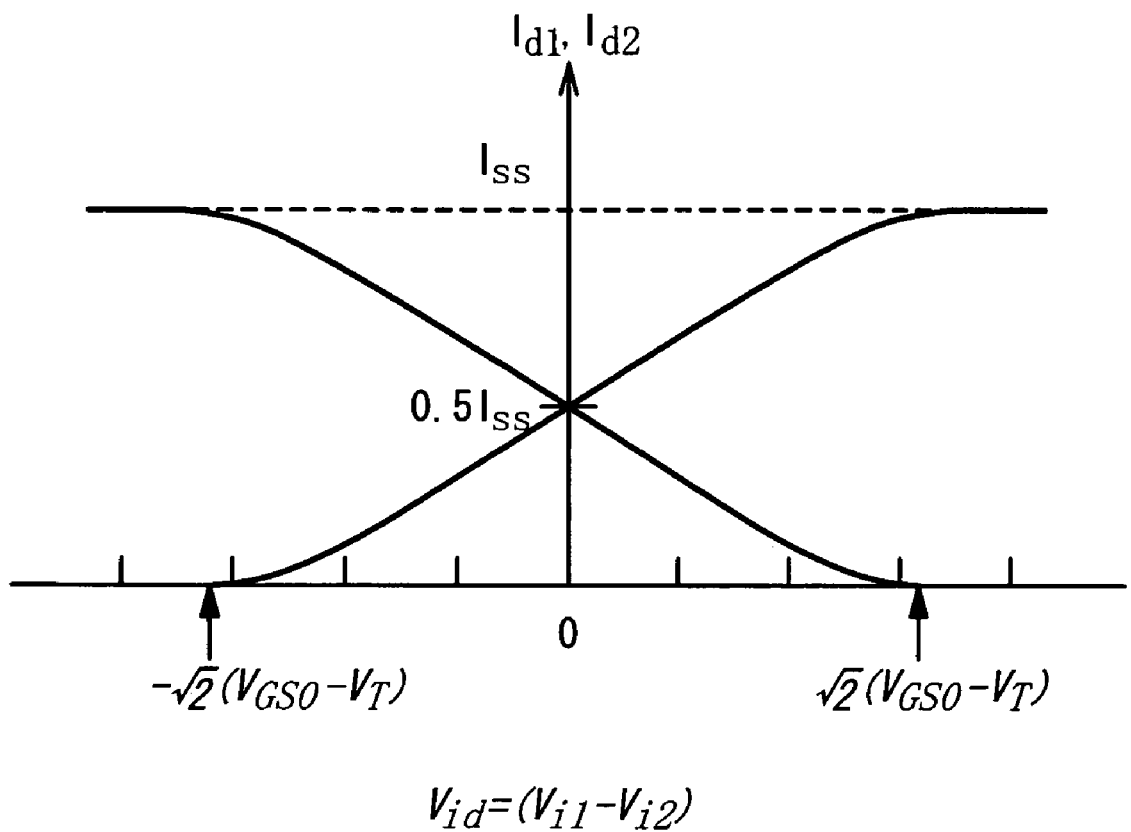
FIG. 3 is a graph illustrating input-to-output characteristics of the differential amplifier stage shown in FIG. 2.

As is understood from the comparison of the formulas (28) and (29) with the formulas (18) and (19), the power consumption presented by formula (29) is lower than that presented by formula (19). In other words, the power consumption of the differential amplifier circuit 40 shown in FIG. 6 is lower than that of the differential amplifier circuit shown in FIG. 1.

Although the voltage comparator circuit is desired to develop a rectangular wave, the output signal of the differential amplifier circuit 40 shown in FIG. 6 exhibits waveform distortion as the increase in the frequency. In this embodiment, therefore, a set of CMOS inverter circuit 41 to 43 is serially connected to the output of the differential amplifier circuit 40 as shown in FIG. 4. The serially-connected CMOS inverter circuits 41 to 43 provide waveform shaping to develop a rectangular wave. Specifically, the threshold level of the CMOS inverters 41 to 43 is set to approximately half of the VDD. When the level of the input of each inverter is lower than the threshold level, each inverter pulls up the output thereof to the high level ($V_{DD}$). When the level of the input of each inverter is higher than the threshold level, on the other hand, each inverter pulls down the output thereof to the low level ($V_{SS}$). Such operation achieves waveform shaping. The use of the multiple CMOS inverters is effective for achieve improved waveform shaping compared to a case where only one CMOS inverter is used for the waveform shaping.

Figure 7A:
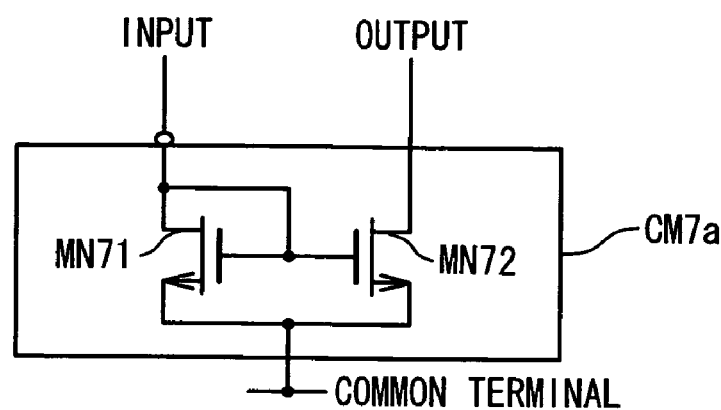
FIGS. 7A and 7B illustrate specific circuit structures of current mirror circuits in one embodiment.
Figure 7B:
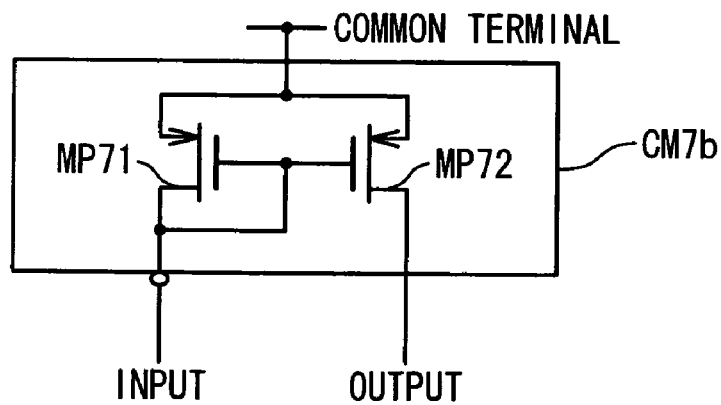

The following is a description of the current mirror circuits incorporated within the differential amplifier circuit 40 shown in FIG. 6. Shown in FIGS. 7A and 7B are Widlar-type current mirror circuits. FIG. 7A illustrates a current mirror circuit CM7a configured to draw a pair of input and output currents. The current mirror circuit CM7a is provided with an N-channel MOS transistor MN71 and an N-channel MOS transistor MN72. The gates of the N-channel MOS transistors MN71 and MN72 are commonly connected to the drain of the N-channel MOS transistor MN71. The drain of the N-channel MOS transistor MN71 is connected the input terminal of the current mirror circuit CM7a. The sources of the N-channel MOS transistors MN71 and MN72 are commonly-connected to the common terminal of the current mirror circuit CM7a. The drain of the N-channel MOS transistor MN72 is connected to the output terminal of the current mirror circuit CM7a.

FIG. 7B illustrates a current mirror circuit CM7b configured to output a pair of input and output currents. The current mirror circuit CM7b is provided with P-channel MOS transistors MP71 and MP72. The gates of the P-channel MOS transistors MP71 and MP72 are commonly connected to the drain of the P-channel MOS transistor MP71. The drain of the P-channel MOS transistor MP71 is connected to the input terminal of the current mirror circuit CM7b. The sources of the P-channel MOS transistors MP71 and MP72 are commonly-connected to the common terminal of the current mirror circuit CM7b. The drain of the P-channel MOS transistor MP72 is connected to the output terminal.

The mirror ratio k of the current mirror circuit CM7a is dependent on the dimensions of the gate widths and lengths of the N-channel MOS transistors MN71 and MN72. When the gate width and length of the N-channel MOS transistor MN71 or the P-channel MOS transistor MP71 are WM1 and LM1, respectively, and the gate width and length of the N-channel MOS transistor MN72 are WM2 and LM2, respectively, the following formula holds:

$$\frac{W_{M1}}{L_{M1}} : \frac{W_{M2}}{L_{M2}} = 1:k \qquad (30)$$

The same applies for the current mirror circuit CM7b.

In this time, a relation of the input and output currents $I_{in}$ and $I_{OUT}$ of the current mirror circuits CM7a (or CM7b) is given by the following formula:

$$I_{OUT} = kI_{in} \qquad (31)$$

This is based on the fact that a drain current $I_D$ is proportional to W/L as is depicted by the formulas (2) to (4) which indicates a relation of the gate-source voltage VGS and the drain current ID of the MOS transistor. The ratios of the gate widths (W) to the gate lengths (L) of the MOS transistors are adjusted to achieve the desired mirror ratio k.

Figure 10:
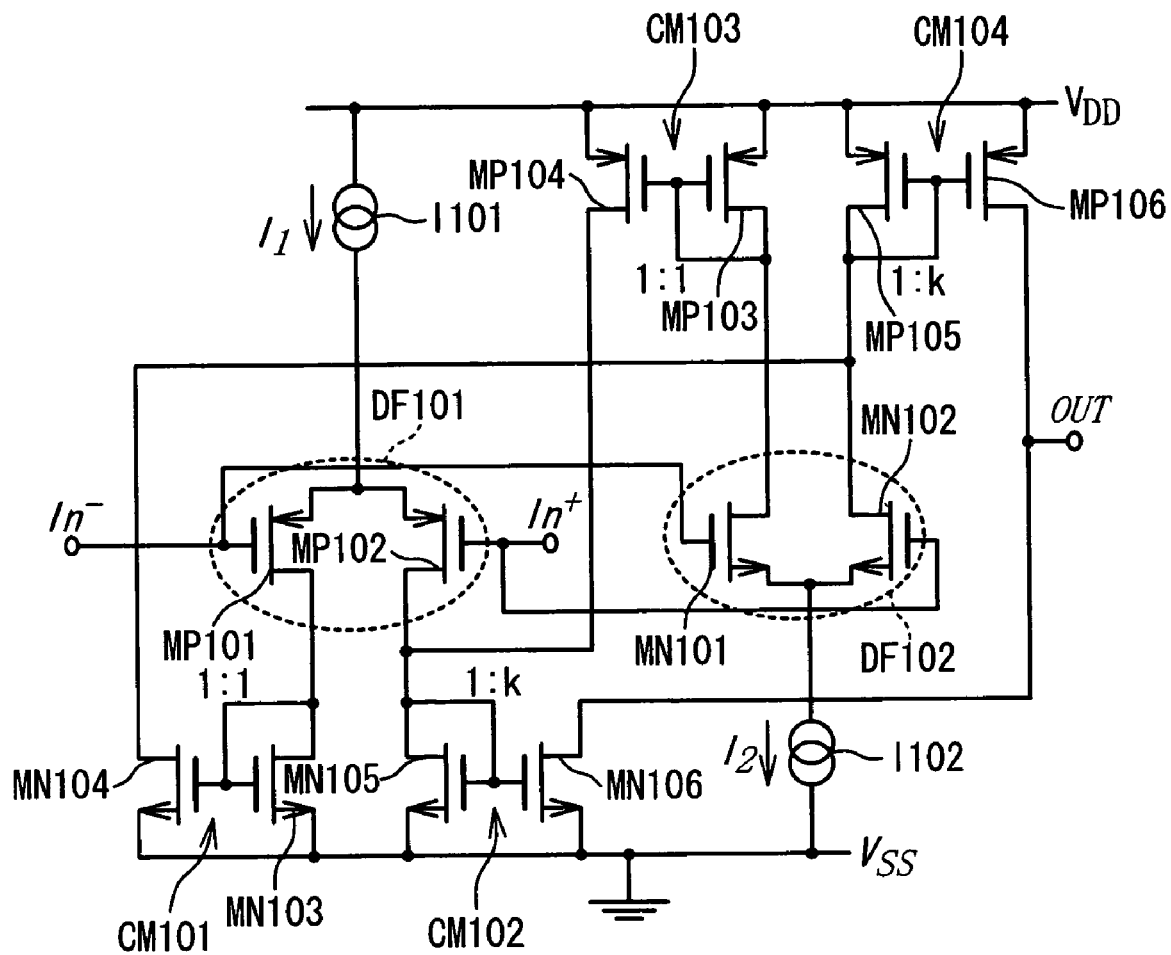
FIG. 10 is a circuit diagram illustrating a circuit structure of the differential amplifier circuit according to the present invention in the case where the differential amplifier circuit incorporates the current mirror circuits shown in FIGS. 7A and 7B.

FIG. 10 is a circuit diagram illustrating a specific circuit structure in which the current mirrors shown in FIGS. 7A and 7B are incorporated as the current mirror circuits CM61 to CM64 within the differential amplifier circuit 40 shown in FIG. 6. The association of circuit elements within the differential amplifier circuit shown in FIG. 10 with those within the differential amplifier circuit shown in FIG. 6 is as follows.

The first differential transistor pair DF61 in FIG. 6 corresponds to a differential transistor pair DF101 in FIG. 10, and the P-channel MOS transistors MP61 and MP62 within the differential transistor pair DF61 correspond to P-channel MOS transistors MP101 and MP102, respectively. The second differential transistor pair DF62 corresponds to a differential transistor pair Df102, and the N-channel MOS transistors MN61 and MN62 within the differential transistor pair DF62 correspond to N-channel MOS transistors MN101 and MN102, respectively.

The first current mirror circuit CM61 corresponds to a current mirror circuit CM101, and the input and output terminals of the first current mirror circuit CM61 correspond to the drains of N-channel MOS transistors MN103 and MN104, respectively. The second current mirror circuit CM62 corresponds to a current mirror circuit 102, and the input and output terminals of the second current mirror circuit CM62 correspond to the drains of N-channel MOS transistors MN105 and MN106, respectively. The third current mirror circuit CM63 corresponds to a current mirror circuit 103, and the input and output terminals of the third current mirror circuit CM63 correspond to the drains of P-channel MOS transistors MP 103 and MP 104, respectively. The fourth current mirror circuit CM64 corresponds to a current mirror circuit 104, and the input and output terminals correspond to the drains of the P-channel MOS transistors MP105 and MP106, respectively. The constant current sources I61 and I62 correspond to constant current sources I101 and I102, respectively.

Strictly speaking, the allowable input voltage range of the differential amplifier circuit shown in FIG. 10 does not cover the entire voltage range between the earth level $V_{SS}$ and the power supply level $V_{DD}$ due to voltage drops across the respective current mirror circuits. That is, there are operation regions where the differential amplifier circuit does not operate in the vicinities of the earth level $V_{SS}$ (GND) and the power supply level $V_{DD}$. This implies that the differential amplifier circuit shown in FIG. 10 does not achieve rail-to-rail operation in a strict sense.

For example, the allowed input voltage range in the vicinity of the earth level $V_{SS}$ (GND) is represented by the following formula:

$$V_{in} < V_{(CM)} - V_{GS(MP)} + V_{DS(sat)} \qquad (32)$$

where Vin is any of the input voltages of the input terminals In⁻ and In⁺, and $V_{(CM)}$ is the voltage drop across the current mirror circuit; $V_{GS(MP)}$ is the gate-source voltage of the P-channel MOS transistor MP101 or MP102, and $V_{DS(sat)}$ is the drain-source voltage at saturation of the P-channel MOS transistor MP101 or MP102. The drain-source voltage at saturation of the P-channel MOS transistor MP101 or MP102 is defined as a voltage barely enough to operate in the pentode region.

Inputting the input voltages that dissatisfy the requirement defined by formula (32) results in that desired characteristics is not obtained. The voltage drop $V_{(CM)}$ across the current mirror circuits in FIG. 7B is indicated by the following formula:

$$V_{(CM)}=V_{GS} \quad (33)$$

where $V_{GS}$ is the gate-source voltage of the MOS transistor, represented by the following formula:

$$V_{GS} = \sqrt{\frac{2I_D}{\beta}} + V_T \quad (34)$$

$$\beta = \frac{W}{L}\mu C_0$$

where $V_T$ is the threshold voltage of the MOS transistor, and $I_D$ is the drain current.

The voltage drop $V_{(CM)}$ in formula (33) is identical to the gate-source voltage $V_{GS}$ of the N-channel MOS transistor, and the voltage $V_{GS(MP)}$ in formula (32) is identical to the gate-source voltage VGS of the P-channel MOS transistor. Therefore, formula (32) implies that the input voltage Vin may not be allowed to be decreased down to the earth level $V_{SS}$ due to variations of the circuit elements. The same goes for the operation range in the vicinity of the power supply level $V_{DD}$. That is, the input voltage Vin may not be allowed to be increased up to the power supply level $V_{DD}$ due to variations of the circuit elements.

Figure 8A:
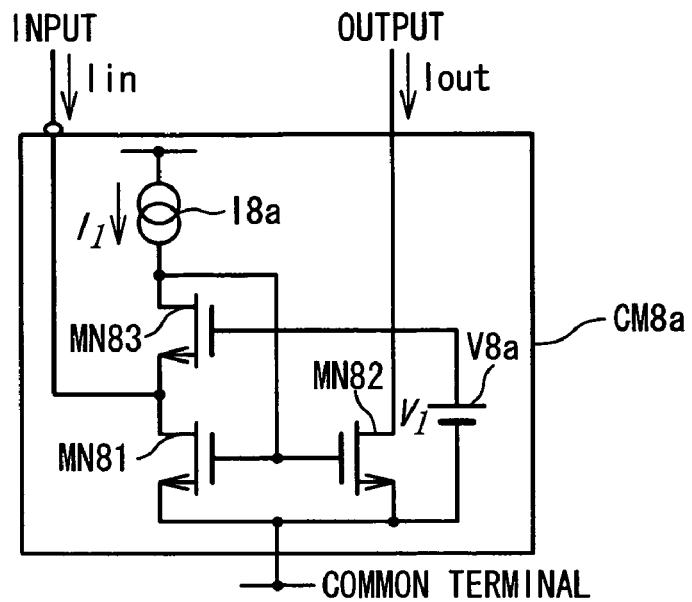
FIGS. 8A and 8B illustrate other specific circuit structures of current mirror circuits in one embodiment.
Figure 8B:
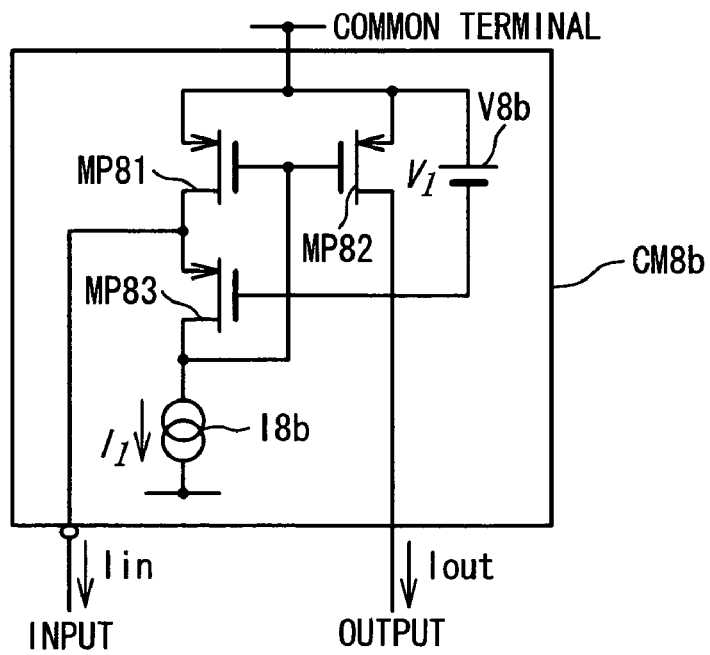

The current mirror circuit structures shown in FIGS. 8A and 8B effectively decrease the voltage drops $V_{(CM)}$ across the current mirror circuits, that is, effectively enlarges the allowable input voltage range compared with the current mirror circuit structures shown in FIGS. 7A and 7B.

The current mirror circuit structures shown in FIGS. 8A and 8B are described in the following. FIG. 8A illustrates a structure of a current mirror circuit CM8a configured to draw a pair of input and output currents. The current mirror circuit CM8a is provided with N-channel MOS transistors MN81, MN82, and MN83, and a constant current source I8a and a constant voltage source V8a. The input terminal of the current mirror circuit CM8a is connected to the drain of the N-channel MOS transistor MN81 and also to the source of the N-channel MOS transistor MN83. The drain of the N-channel MOS transistor MN83 is connected to the gates of the N-channel MOS transistors MN81 and MN82, and also to the constant current source I8a. The gate of the N-channel MOS transistor MN83 is connected to the constant voltage source V8a, and is pull up to a voltage level of the voltage $V_1$ with respect to the common terminal. The drain of the N-channel MOS transistor MN82 is connected to the output terminal of the current mirror circuit CM8a. The sources of the N-channel MOS transistors MN82 and MN81 are commonly-connected to the common terminal of the current mirror circuit CM8a.

FIG. 8B illustrates a current mirror circuit CM8b configured to supply a pair of input and output currents. The current mirror circuit CM8b is provided with P-channel MOS transistors MP81, MP82, and MP83, a constant current source I8b, and a constant voltage source V8b. The input terminal of the current mirror circuit CM8b is connected to the drain of the P-channel MOS transistor MP81 and the source of the P-channel MOS transistor MP83. The drain of the P-channel MOS transistor MP83 is connected to the gates of the P-channel MOS transistors MP81 and MP82, and the constant current source I8b. The gate of the P-channel MOS transistor MP83 is connected to the constant voltage source V8b, and is set to a voltage level lower by $V_1$ than the voltage level of the common terminal. The drain of the P-channel MOS transistor MP82 is the output terminal of the current mirror circuit CM8b. The sources of the P-channel MOS transistors MP82 and MP81 are connected, and the connection point is the common terminal of the current mirror circuit CM8b.

A description is made of the input-to-output characteristics of the current mirror circuits CM8a/CM8b in the following. The current Iin from the input terminal and the current I1 from the constant current source I8a (or I8b) flow through the drain of the N-channel MOS transistor MN81 or the P-channel MOS transistor MP81. Therefore, a drain current $I_{D(M1)}$ of the N-channel MOS transistor MN81 or the P-channel MOS transistor MP81 is the currents Iin and I1 added together, and therefore the drain current $I_{D(M1)}$ is represented by the following formula:

$$I_{D(M1)}=I_{in}+I_1 \quad (35)$$

When dimensions of the N-channel MOS transistors MN81 and MN82 are designed as defined by formula (30), a relation of the input and output currents Iin and $I_{OUT}$ of the current mirror circuits CM8a and CM8b is represented by the following formula:

$$I_{OUT}=k(I_{in}+I_1) \quad (36)$$

When the input current Iin is extremely larger than the constant current I1, the following formula holds:

$$I_{OUT}\cong kI_{in} \quad (37)$$

Formula (37) indicates that the current mirror circuits in FIG. 8A operate to exhibit a mirror ratio of k.

The current mirror circuit structures shown in FIGS. 8A and 8B effectively reduces the voltage drops thereacross compared to those of the current mirror circuits shown in FIGS. 7A and 7B. The voltage drops $V_{(CM)}$ across the current mirror circuits shown in FIGS. 8A and 8B are represented by the following formula:

$$V_{(CM)}=V_1-V_{GS(M3)} \quad (38)$$

where $V_1$ is the voltage developed by the constant voltage source V8a or V8b, and $V_{GS(M3)}$ is the gate-source voltage of the N-channel MOS transistor MN83 or the P-channel MOS transistor MP83.

There is a limit to the reduction in the voltage drop $V_{(CM)}$ across the current mirror circuits due to the fact that the voltage $V_1$ is required to satisfy a certain requirement. Specifically, the voltage $V_1$ is required to satisfy a condition in which the N-channel MOS transistor MN81 or the P-channel MOS transistor MP81 operates in the pentode region. The condition is represented by the following formula:

$$V_{DS(sat)(M1)}<V_1-V_{GS(M3)} \quad (39)$$

where $V_{GS(M3)}$ is the gate-source voltage of the MOS transistors MN83 or MP83, and $V_{DS(sat)(M1)}$ is the drain-source voltage at saturation of the MOS transistors MN81/MP81, which is defined as a voltage barely enough to operate in the pentode region.

Formula (39) describes a lower limit of the constant voltage source voltage $V_1$, and there is also an upper higher limit as well. An excessive increase in the constant voltage source voltage $V_1$ undesirably results in that the MOS transistors MN83 and MP83 enter a triode region, causing a problem that the MOS transistors MN83 and MP83 do not carry out desired operation. The condition defining the higher limit of the constant voltage source voltage $V_1$ is represented by the following formula:

$$V_{DS(sat)(M3)} \leq V_{GS(M1)} - (V_1 - V_{GS(M3)}) \tag{40}$$

where $V_{GS(M1)}$ is the gate-source voltage of the MOS transistor MN81 or MP81; VGS(M3) is the gate-source voltage of the MOS transistor MN83 or MP83; and $V_{DS(sat)(M3)}$ is the drain-source voltage at saturation of the MOS transistor MN83 or MP83, which is defined as a voltage barely enough to operate in the pentode region.

The voltage $V_1$ is required to be configured so as to meet the two requirements defined by formulas (39) and (40). When the voltage $V_1$ is configured to satisfy these requirements, the voltage drops $V_{(CM)}$ of the current mirror circuits may be decreased down to approximately 0.2 V. As a result, the input voltages Vin⁻ and Vin⁺ of the differential amplifier circuit are allowed to range approximately from the earth level $V_{SS}$ to the power supply level $V_{DD}$. In other words, the use of the current mirror circuits shown in FIG. 8 within the differential amplifier circuit 40 in FIG. 6 effectively expands the allowable input voltage range.

Figure 9:
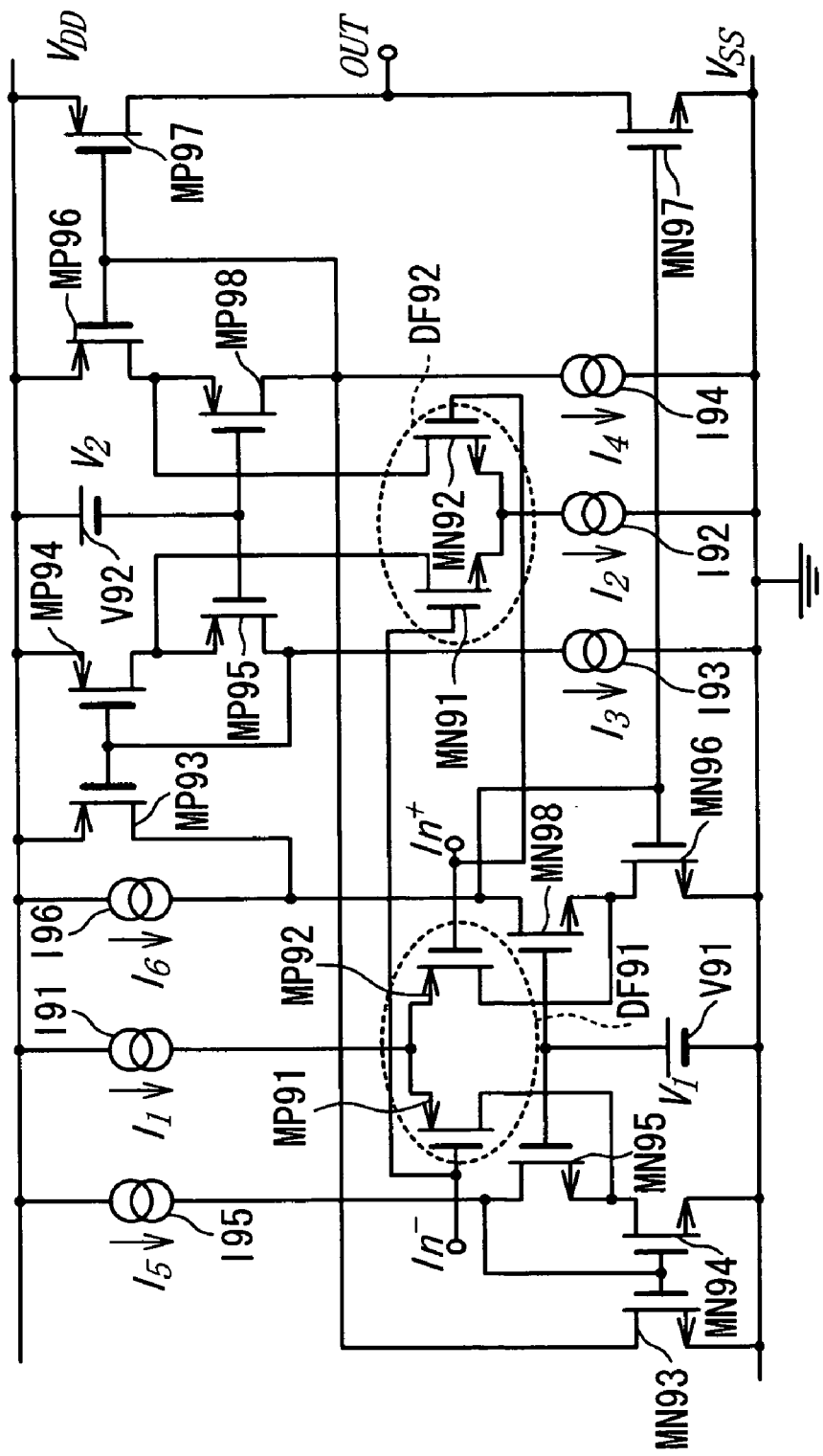
FIG. 9 is a circuit diagram illustrating a circuit structure of the differential amplifier circuit according to the present invention in the case where the differential amplifier circuit incorporates the current mirror circuits shown in FIGS. 8A and 8B.

FIG. 9 is a circuit diagram illustrating a specific circuit structure in which the current mirrors shown in FIGS. 8A and 8B are incorporated as the current mirror circuits CM61 to CM64 within the differential amplifier circuit 40 shown in FIG. 6; the current mirror circuits shown in FIG. 8A are incorporated as the current mirror circuits CM61 and CM62 shown in FIG. 6, and the current mirror circuits shown in FIG. 8B are incorporated as the current mirror circuits CM63 and CM64. The association of circuit elements within the differential amplifier circuit shown in FIG. 9 with those within the differential amplifier circuit shown in FIG. 6 is as follows.

The first differential transistor pair DF61 in FIG. 6 corresponds to a differential transistor pair DF91 in FIG. 9, and the P-channel MOS transistors MP61 and MP62 forming the differential transistor pairs correspond to P-channel MOS transistors MP91 and MP92. The second differential transistor pair DF62 corresponds to a differential transistor pair DF92, and the N-channel MOS transistors MN61 and MN62 forming the differential transistor pairs correspond to N-channel MOS transistors MN91 and MN92. The constant current sources I61 and I62 correspond to constant current sources I91 and I92.

The first current mirror circuit CM61 corresponds to N-channel MOS transistors MN93, MN94 and MN 95, a constant current source I95, and a constant voltage source V91. The input terminal of the first current mirror circuit CM61 corresponds to a connection point of the drain of the N-channel MOS transistor MN94 and the source of the N-channel MOS transistor MN95, and the output terminal of the first current mirror circuit CM61 corresponds to the drain of the N-channel MOS transistor MN93. A correspondence with the current mirror circuit in FIG. 8A is as follows. The constant current source I95 and the constant voltage source V91 correspond to the constant current source I8a and the constant voltage source V8a in FIG. 8A, respectively. The N-channel MOS transistors MN94, MN93, and MN95 correspond to the N-channel MOS transistors MN81, MN82, and MN83 in FIG. 8A, respectively.

The second current mirror circuit CM62 corresponds to N-channel MOS transistors MN96, MN97, and MN98, a constant current source I96, and the constant voltage source V91. The constant voltage source V91 supplies a bias voltage, and is shared by the first and second current mirror circuits CM61 and CM62. The input terminal of the second current mirror circuit CM62 corresponds to a connection point of the drain of the N-channel MOS transistor MN96 and the source of the N-channel MOS transistor MN98, and the output terminal corresponds to the drain of the N-channel MOS transistor MN97. The current from the third current mirror circuit is inputted through the N-channel MOS transistor MN98. A correspondence with the current mirror circuit in FIG. 8A is as follows. The constant current source I96 and the constant voltage source V91 correspond to the constant current source I8a and the constant voltage source V8a, respectively. The N-channel MOS transistors MN96, MN97, and MN98 correspond to the N-channel MOS transistors MN81, MN82, and MN83, respectively.

The third current mirror circuit CM63 corresponds to P-channel MOS transistors MP93, MP94, and MP95, a constant current source I93, and a constant voltage source V92. The input terminal corresponds to a connection point of the drain of the P-channel MOS transistor MP94 and the source of the P-channel MOS transistor MP95, and the output terminal corresponds to the drain of the P-channel MOS transistor MP93. A correspondence with the current mirror circuit in FIG. 8B is as follows. The constant current source I93 and the constant voltage source V92 correspond to the constant current source I8b and the constant voltage source V8b in FIG. 8B, respectively. The P-channel MOS transistors MP94, MP93, and MP95 correspond to the P-channel MOS transistors MP81, MP82, and MP83 in FIG. 8B, respectively.

The fourth current mirror circuit CM64 corresponds to P-channel MOS transistors MP96, MP97, and MP98, a constant current source I94, and the constant voltage source V92. The constant voltage source V92 only supplies the bias, and is shared by the third and fourth current mirror circuits CM63 and CM64. The input terminal of the fourth current mirror circuit CM64 corresponds to a connection point of the drain of the P-channel MOS transistor MP96 and the source of the P-channel MOS transistor MP98, and the output terminal of the fourth current mirror circuit CM64 corresponds to the drain of the P-channel MOS transistor MP97. The current from the first current mirror circuit is inputted through the P-channel MOS transistor MP98; the current flows from the P-channel MOS transistor MP98 toward the N-channel MOS transistor MN93. A correspondence with the current mirror circuit in FIG. 8B is as follows. The constant current source I94 and the constant voltage source V92 correspond to the constant current source I8b and the constant voltage source V8b in FIG. 8B, respectively. The P-channel MOS transistors MP96, MP97, and MP98 correspond to the P-channel MOS transistors MP81, MP82, and MP83 in FIG. 8B, respectively.

Figure 11:
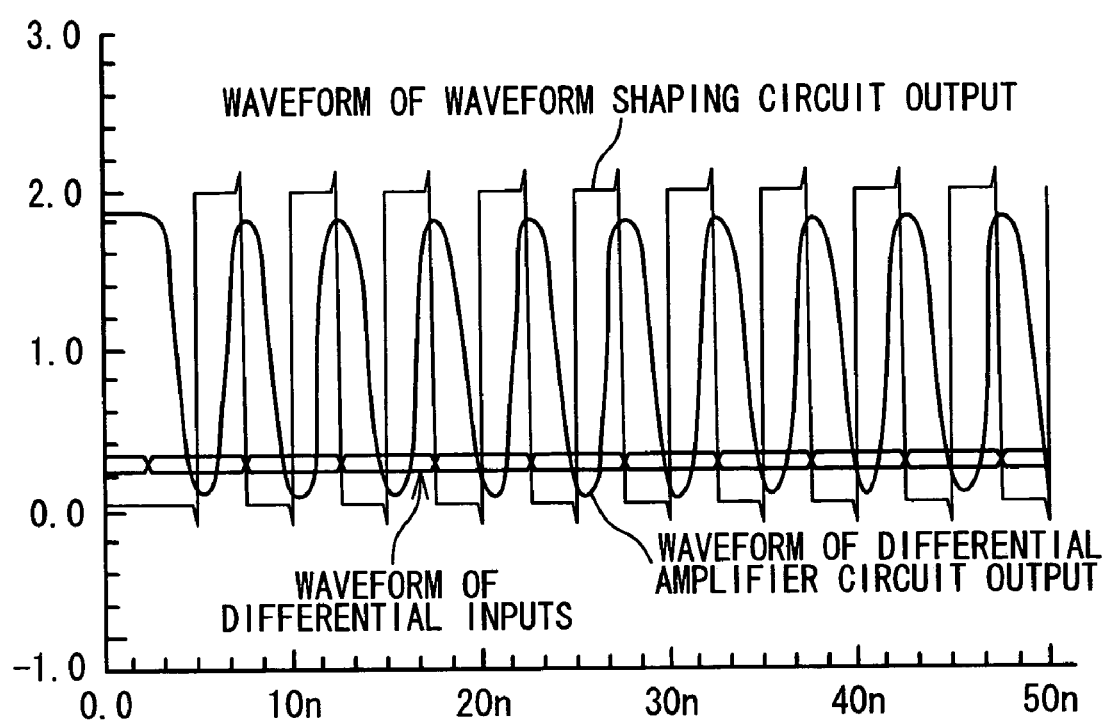
FIG. 11 is a graph illustrating waveforms of input and output voltages obtained a circuit simulation of voltage comparator circuit according to the present invention.

FIG. 11 illustrates simulated waveforms of the input voltages, the output signal of the differential amplifier circuit designed as mentioned above, and a resultant output signal developed by the serially-connected CMOS inverters.

As thus described, the voltage comparator circuit of the present invention is especially suitable for a high-speed differential interface circuit operating on a low power source voltage and exhibiting a wide allowable input voltage range. The use of the circuit according to the present invention makes it possible to realize a voltage comparator circuit that is low in the power consumption, wide in the allowable input voltage range, and is high in a speed, with a fewer number of elements.

It is apparent that the present invention is not limited to the above-described embodiments, which may be modified and changed without departing from the scope of the invention.

What is claimed is:

1. A voltage comparator circuit comprising:
a differential amplifier circuit receiving a pair of input signals to develop an output signal on an output terminal; and
a waveform shaping circuit achieving waveform shaping of said output signal received from said differential amplifier circuit,
wherein said differential amplifier circuit includes:
a first differential transistor pair responsive to said pair of input signals to output first and second output currents;
a second differential transistor pair complementary to said first differential transistor pair, and responsive to said pair of input signals to output third and fourth output currents;
a first current mirror circuit developing a first internal current in response to said first output current;
a third current mirror circuit complementary to said first current mirror circuit and developing a third internal current in response to said third output current;
a second current mirror circuit developing a second internal current in response to said second output current and said third internal current; and
a fourth current mirror circuit complementary to said second current mirror circuit and developing a fourth internal current in response to said fourth output current and said first internal current,
wherein a resultant current which is said second and fourth internal currents added together is drawn from or supplied to said output terminal of said differential amplifier circuit,
wherein said first differential transistor pair comprises first and second MOS transistors of a first conductive type,
wherein said second differential transistor pair comprises third and fourth MOS transistors of a second conductive type complementary to said first conductive type,
wherein said differential amplifier circuit further includes:
a first constant current source connected to commonly-connected sources of said first and second MOS transistors; and
a second constant current source connected to commonly-connected sources of said third and fourth MOS transistors,
wherein a drain of said first MOS transistor is connected to an input of said first current mirror circuit,
wherein a drain of said second MOS transistor is connected to an input of said second current mirror circuit,
wherein a drain of said third MOS transistor is connected to an input of said third current mirror circuit,
wherein a drain of said fourth MOS transistor is connected to an input of said fourth current mirror circuit,
wherein gates of said first and third MOS transistors are commonly connected to one of input terminals of said differential amplifier circuit,
wherein gates of said second and fourth MOS transistors are commonly connected to another of said input terminals of said differential amplifier circuit,
wherein each of said first to fourth current mirror circuits includes:
fifth and sixth MOS transistors having commonly-connected gates and commonly-connected sources;
a seventh MOS transistor having a drain connected to said commonly-connected gates of said fifth and sixth MOS transistors, and a source connected to a drain of said fifth MOS transistor, a gate of said seventh MOS transistor being connected to a constant voltage source;
a constant current source connected to said drain of said seventh MOS transistor;
a current input connected to said drain of said fifth MOS transistor and to said source of said seventh MOS transistor;
a common terminal connected to said commonly-connected sources of said fifth and sixth MOS transistors; and
a current output connected directly to a drain of said sixth MOS transistor.

2. The voltage comparator circuit according to claim 1, wherein said first current mirror circuit is designed to develop said first internal current so that said first internal current has a current level identical to that of said first output current,
wherein said third current mirror circuit is designed to develop said third internal current so that said third internal current has a current level identical to that of said third output current,
wherein said second current mirror circuit is designed to develop said second internal current so that said second internal current has a current level identical to k times of that of said second output current and said third internal current added together, k being larger than one, and
wherein said fourth current mirror circuit is designed to develop said fourth internal current so that said fourth internal current has a current level identical to k times of that of said fourth output current and said first internal current added together.

3. The voltage comparator circuit according to claim 1, wherein said waveform shaping circuit includes at least one inverter circuit.

4. The voltage comparator circuit according to claim 3, wherein said at least one inverter circuit comprises:
a P-channel MOS transistor; and
an N-channel MOS transistor,
wherein drains of said P-channel and N-channel transistors are commonly-connected to an output of said inverter circuit,
wherein gates of said P-channel and N-channel transistors are commonly-connected to an input of said inverter circuit,
wherein a source of said P-channel MOS transistor is connected to a power supply terminal, and
wherein a source of said N-channel MOS transistor is connected to an earth terminal.

5. The voltage comparator circuit according to claim 3, wherein said at least one inverter circuit comprises a plurality of serially-interconnected inverters.

6. The voltage comparator circuit according to claim 3, wherein said waveform shaping circuit outputs a signal non-linear to said output signal.

7. The voltage comparator circuit according to claim 1, wherein a first signal path from said first differential transistor pair to said output terminal comprises a number of circuit elements identical to that along a second signal path from said second differential transistor pair to said output terminal.

8. The voltage comparator circuit according to claim 1, wherein said waveform shaping circuit shapes said output signal such that said output signal is shaped to have a characteristic of a square wave.

9. A voltage comparator circuit comprising:
a differential amplifier circuit, and
a set of CMOS inverter circuits serially-connected to an output terminal of said differential amplifier circuit, wherein said differential amplifier circuit includes:
a first differential transistor pair comprising first and second P-channel MOS transistors;
a second differential transistor pair comprising first and second N-channel MOS transistors;
a first current mirror circuit mirroring a drain output of said first P-channel MOS transistor;
a second current mirror circuit mirroring a drain output of said second P-channel MOS transistor;
a third current mirror circuit mirroring a drain output of said first N-channel MOS transistor; and
a fourth current mirror circuit mirroring a drain output of said second N-channel MOS transistor,
wherein an output of said first current mirror circuit is connected to an input of said fourth current mirror circuit,
wherein an output of said third current mirror circuit is connected to an input of said second current mirror circuit,
wherein outputs of said second and fourth current mirror circuits are commonly connected to said output terminal of said differential amplifier circuit,
wherein gates of said first P-channel MOS transistor and said first N-channel MOS transistor are commonly-connected to an inverting input,
wherein gates of said second P-channel MOS transistor and said second N-channel MOS transistor are commonly-connected to an non-inverting input,
wherein each of said first to fourth current mirror circuits includes:
first and second MOS transistors having commonly-connected gates and commonly-connected sources;
a third MOS transistor having a source connected to a drain of said first MOS transistor, a drain connected to said commonly-connected gates of said first and second MOS transistors, a gate of said third MOS transistor being connected to a constant voltage source;
a constant current source connected to said drain of said third MOS transistor;
a current input connected to said drain of said first MOS transistor and to said source of said third MOS transistor;
a common terminal connected to said commonly-connected sources of said first and second MOS transistors; and
a current output connected directly to a drain of said second MOS transistor.

10. The voltage comparator circuit according to claim 9, wherein said second and fourth current mirror circuits have a mirror ratio of k, k being larger than one.

11. A voltage comparator circuit comprising:
a differential amplifier circuit receiving a pair of input signals to develop an output signal on an output terminal; and
a waveform shaping circuit achieving waveform shaping of said output signal received from said differential amplifier circuit such that said output signal is shaped to have a characteristic of a square wave,
wherein said differential amplifier circuit includes:
a first differential transistor pair responsive to said pair of input signals to output first and second output currents;
a second differential transistor pair complementary to said first differential transistor pair, and responsive to said pair of input signals to output third and fourth output currents;
a first current mirror circuit developing a first internal current in response to said first output current;
a third current mirror circuit complementary to said first current mirror circuit and developing a third internal current in response to said third output current;
a second current mirror circuit developing a second internal current in response to said second output current and said third internal current; and
a fourth current mirror circuit complementary to said second current mirror circuit and developing a fourth internal current in response to said fourth output current and said first internal current,
wherein a resultant current which is said second and fourth internal currents added together is drawn from or supplied to said output terminal of said differential amplifier circuit, and
wherein each of said first to fourth current mirror circuits includes:
fifth and sixth transistors having commonly-connected gates and commonly-connected sources;
a seventh transistor having a drain connected to said commonly-connected gates of said fifth and sixth transistors, and a source connected to a drain of said fifth transistor, a gate of said seventh transistor being connected to a constant voltage source;
a constant current source connected to said drain of said seventh transistor;
a current input connected to said drain of said fifth transistor and to said source of said seventh transistor;
a common terminal connected to said commonly-connected sources of said fifth and sixth transistors; and
a current output connected directly to a drain of said sixth transistor.

12. The voltage comparator circuit according to claim 11, wherein a first signal path from said first differential transistor pair to said output terminal comprises a number of elements identical to that along a second signal path from said second differential transistor pair to said output terminal.

13. The voltage comparator circuit according to claim 11, wherein said first current mirror circuit is designed to develop said first internal current so that said first internal current has a current level identical to that of said first output current,
wherein said third current mirror circuit is designed to develop said third internal current so that said third internal current has a current level identical to that of said third output current,
wherein said second current mirror circuit is designed to develop said second internal current so that said second internal current has a current level identical to k times of that of said second output current and said third internal current added together, k being larger than one, and
wherein said fourth current mirror circuit is designed to develop said fourth internal current so that said fourth internal current has a current level identical to k times of that of said fourth output current and said first internal current added together.

14. The voltage comparator circuit according to claim 11, wherein said waveform shaping circuit includes at least one inverter circuit.

15. The voltage comparator circuit according to claim 14, wherein said at least one inverter circuit comprises:
a P-channel MOS transistor; and
an N-channel MOS transistor,
wherein drains of said P-channel and N-channel transistors are commonly-connected to an output of said inverter circuit, wherein gates of said P-channel and N-channel transistors are commonly-connected to an input of said inverter circuit, wherein a source of said P-channel MOS transistor is connected to a power supply terminal, and wherein a source of said N-channel MOS transistor is connected to an earth terminal.

16. The voltage comparator circuit according to claim 14, wherein said at least one inverter circuit comprises a plurality of serially-interconnected inverters.

17. The voltage comparator circuit according to claim 14, wherein said waveform shaping circuit outputs a signal non-linear to said output signal.

18. The voltage comparator circuit according to claim 11, wherein said first differential transistor pair comprises:
   first and second MOS transistors of first conductive type,
   wherein said second differential transistor pair comprises:
   third and fourth MOS transistors of second conductive type complementary to said first conductive type, wherein said differential amplifier circuit further includes:
   a first constant current source connected to commonly-connected sources of said first and second MOS transistors; and
   a second constant current source connected to commonly-connected sources of said third and fourth MOS transistors, wherein a drain of said first MOS transistor is connected to an input of said first current mirror circuit, wherein a drain of said second MOS transistor is connected to an input of said second current mirror circuit, wherein a drain of said third MOS transistor is connected to an input of said third current mirror circuit, wherein a drain of said fourth MOS transistor is connected to an input of said fourth current mirror circuit, wherein gates of said first and third MOS transistors are commonly connected to one of input terminals of said differential amplifier circuit, and wherein gates of said second and fourth MOS transistors are commonly connected to another of said input terminals of said differential amplifier circuit.

* * * * *